United States Patent
Wakamiya et al.

(10) Patent No.: US 10,937,972 B2
(45) Date of Patent: Mar. 2, 2021

(54) COMPLEX AND PEROVSKITE MATERIAL, AND PEROVSKITE-TYPE SOLAR CELL USING COMPLEX OR PEROVSKITE MATERIAL

(71) Applicant: Kyoto University, Kyoto (JP)

(72) Inventors: Atsushi Wakamiya, Kyoto (JP); Yumi Hirose, Kyoto (JP); Ai Shimazaki, Kyoto (JP)

(73) Assignee: Kyoto University, Kyoto (JP)

( * ) Notice: Subject to any disclaimer, the term of this patent is extended or adjusted under 35 U.S.C. 154(b) by 0 days.

(21) Appl. No.: 16/061,068

(22) PCT Filed: Dec. 16, 2016

(86) PCT No.: PCT/JP2016/087529
§ 371 (c)(1),
(2) Date: Jun. 11, 2018

(87) PCT Pub. No.: WO2017/104792
PCT Pub. Date: Jun. 22, 2017

(65) Prior Publication Data
US 2018/0366657 A1    Dec. 20, 2018

(30) Foreign Application Priority Data
Dec. 16, 2015    (JP) ................................ 2015-245525

(51) Int. Cl.
*H01L 51/44*    (2006.01)
*H01G 9/20*    (2006.01)
(Continued)

(52) U.S. Cl.
CPC ............ *H01L 51/0077* (2013.01); *C07F 7/24* (2013.01); *H01G 9/0036* (2013.01);
(Continued)

(58) Field of Classification Search
CPC ............ H01L 51/0077; H01L 51/0007; H01L 51/0028; H01L 51/4253; H01G 9/0036; H01G 9/2009; C07F 7/24
See application file for complete search history.

(56) References Cited

U.S. PATENT DOCUMENTS

2004/0173752 A1* 9/2004 Shibuya ............... C09K 11/664
250/363.03
2013/0233377 A1* 9/2013 Kanatzidis ......... G01N 21/6402
136/252
(Continued)

FOREIGN PATENT DOCUMENTS

EP        3136450 A1 *  3/2017  ......... H01L 51/0003
WO    2015/099412 A1     7/2015
WO    2015/139082 A1     5/2019

OTHER PUBLICATIONS

Yunlong Guo et al., "Chemical Pathways Connecting Lead(II) Iodide and Perovskite via Polymeric Plumbate(II) Fiber," Journal of the American Chemical Society, 2015, vol. 137, pp. 15907-15914. (cited in the International Search Report and the IPRP).
(Continued)

*Primary Examiner* — Golam Mowla
(74) *Attorney, Agent, or Firm* — Locke Lord LLP

(57) ABSTRACT

The complex comprising one or more of the compound represented by general formula: $RPb_{n1}X_{m1}$ (wherein R is a cation represented by $R^1NH_3^+$ (wherein $R^1$ represents a univalent substituted or unsubstituted hydrocarbon group), or the following formula:

(Continued)

(wherein $R^2$ represents a hydrogen atom, or a univalent substituted or unsubstituted hydrocarbon group); X is the same or different, and each represents a halogen atom; n1 is 0.8 to 1.2; and m1 is 2.8 to 3.2, or the compound represented by general formula: $R_2Pb_{n2}X_{m2}$ wherein R and X are as defined above; n2 is 2.8 to 3.2; and m2 is 7.7 to 8.3; and one or more dimethylformamide molecules is capable of decreasing the stirring time upon dissolution in an organic solvent such as DMSO, as well as decreasing the hysteresis and improving the solar cell characteristics (in particular, photoelectric conversion efficiency) when the complex is applied to a perovskite layer.

23 Claims, 20 Drawing Sheets

(51) Int. Cl.
  *H01L 51/42* (2006.01)
  *H01L 51/00* (2006.01)
  *C07F 7/24* (2006.01)
  *H01G 9/00* (2006.01)

(52) U.S. Cl.
  CPC ....... *H01G 9/2009* (2013.01); *H01L 51/0007* (2013.01); *H01L 51/0028* (2013.01); *H01L 51/4253* (2013.01); *H01L 51/44* (2013.01); *Y02E 10/549* (2013.01); *Y02P 70/50* (2015.11)

(56) References Cited

U.S. PATENT DOCUMENTS

| | | | | |
|---|---|---|---|---|
| 2015/0122314 A1* | 5/2015 | Snaith | ................ | H01L 51/4213 136/255 |
| 2016/0251383 A1* | 9/2016 | Zhu | .......................... | C07F 7/24 556/81 |
| 2016/0322591 A1 | 11/2016 | Seok et al. | | |

OTHER PUBLICATIONS

Feng Hao et al., "Controllable Perovskite Crystallization at a Gas-Solid Interface for Hole Conductor-Free Solar Cells with Steady Power Conversion Efficiency over 10%," Journal of the American Chemical Society, 2014, vol. 136, 3p.16411-16419. (cited in the International Search Report and the IPRP).
Petr P. Khlyabich et al., "Crystalline Intermediates and Their Transformation Kinetics during the Formation of Methylammonium Lead Halide Perovskite Thin Films," Chemistry of Materials, 2016, vol. 28, pp. 9041-9048. (cited in the International Search Report).
Makhsud I. Saidaminov et al., "Retrograde solubility of formamidinium and methylammonium lead halide perovskites enabling rapid single crystal growth," Chemical Communications, 2015, vol. 51, No. 100, pp. 17658-17661. (cited in the International Preliminary Report on Patentability).
Akkihiro Kojima et al., "Organometal Halide Perovskites as Visible-Light Sensitizers for Photovoltaic Cells," Journal of the American Chemical Society, 2009, vol. 131, pp. 6050-6051. (discussed in the specification).
Michael M. Lee et al., "Efficient Hybrid Solar Cells Based on Meso-Superstructured Organometal Halide Perovskites," Science, 2012, vol. 338, pp. 643-647 and information sheet. (discussed in the specification).
Jin Hyuck Heo et al., "Efficient inorganic-organic hybrid heterojunction solar cells containing perovskite compound and polymeric hole conductors," Nature Photonics, 2013, vol. 7, pp. 486-491. (discussed in the specification).
Julian Burschka et al.,"Sequential deposition as a route to high-performance perovskite-sensitized solar cells," Nature, 2013, vol. 499, pp. 316-319 and information sheet. (discussed in the specification).
Mingzhen Liu et al., "Efficient planar heterojunction perovskite solar cells by vapour deposition," Nature, 2013, vol. 501, pp. 395-398 and information sheets. (discussed in the specification).
Qi Chen et al., "Planar Heterojunction Perovskite Solar Cells via Vapor-Assisted Solution Process," Journal of the American Chemical Society, 2014, vol. 136, pp. 622-625. (discussed in the specification).
International Search Report dated Mar. 7, 2017, issued for PCT/JP2016/087529.
Marek Szafranski, "Investigation of phase instabilities in guanidinium halogenoplumbates(II)," Thermochimica Acta, 1997, vol. 307, pp. 177-183. (cited in the May 31, 2019 Search Report issued for EP16875766.4).
Supplementary European Search Report dated May 31, 2019, issued for the corresponding EP patent application No. 16875766.4.
Anne Marie Helmenstine, PhD., "Dissolve Definition of Chemistry" at the following URL: <https://www.thoughtco.com/definition-of-dissolve-604432>, updated May 8, 2019.
T. M. Koh et al., "Formamidinium-Containing Metal-Halide: An Alternative Material for Near-IR Absorption Perovskite Solar Cells," The Journal of Physical Chemistry C, 2014, vol. 118, pp. 16458-16462. (cited in the Feb. 3, 2020 Office Action issued for CN201680074098.2.
Office Action dated Feb. 3, 2020, issued for the corresponding Chinese patent application No. 201680074098.2 and English translation thereof.

* cited by examiner

Fig. 1

MAPbI3 DMF

| Element | Concentration [ppm wt] | Element | Concentration [ppm wt] |
|---|---|---|---|
| Li | < 0.5 | In | < 0.5 |
| Be | < 0.5 | Sn | < 0.5 |
| B | < 0.5 | Sb | < 0.5 |
| Na | 9 | Te | < 0.5 |
| Mg | 1.0 | Cs | < 0.5 |
| Al | < 0.5 | Ba | < 0.5 |
| Si | 12 | La | < 0.5 |
| P | < 5 | Ce | < 0.5 |
| K | < 5 | Pr | < 0.5 |
| Ca | < 5 | Nd | < 0.5 |
| Sc | < 0.5 | Sm | < 0.5 |
| Ti | < 0.5 | Eu | < 0.5 |
| V | < 0.5 | Gd | < 0.5 |
| Cr | < 0.5 | Tb | < 0.5 |
| Mn | < 0.5 | Dy | < 0.5 |
| Fe | < 5 | Ho | < 0.5 |
| Co | < 0.5 | Er | < 0.5 |
| Ni | < 0.5 | Tm | < 0.5 |
| Cu | < 0.5 | Yb | < 0.5 |
| Zn | < 0.5 | Lu | < 0.5 |
| Ga | < 0.5 | Hf | < 0.5 |
| Ge | < 0.5 | Ta | < 0.5 |
| As | < 0.5 | W | < 0.5 |
| Se | < 0.5 | Re | < 0.5 |
| Rb | < 0.5 | Os | < 0.5 |
| Sr | < 0.5 | Ir | < 0.5 |
| Y | < 0.5 | Pt | < 0.5 |
| Zr | < 0.5 | Au | < 0.5 |
| Nb | < 0.5 | Hg | < 0.5 |
| Mo | < 0.5 | Tl | < 0.5 |
| Ru | < 0.5 | Pb | < 0.5 |
| Rh | 2.6 | Bi | < 0.5 |
| Pd | < 0.5 | Th | < 0.5 |
| Ag | < 0.5 | U | < 0.5 |
| Cd | < 0.5 | | |

Fig. 4

FAPbI3 2DMF

| Element | Concentration [ppm wt] | Element | Concentration [ppm wt] |
|---|---|---|---|
| Li | < 0.5 | In | < 0.5 |
| Be | < 0.5 | Sn | < 0.5 |
| B | < 0.5 | Sb | < 0.5 |
| Na | 5 | Te | < 0.5 |
| Mg | < 0.5 | Cs | < 0.5 |
| Al | < 0.5 | Ba | < 0.5 |
| Si | < 5 | La | < 0.5 |
| P | < 5 | Ce | < 0.5 |
| K | < 5 | Pr | < 0.5 |
| Ca | < 5 | Nd | < 0.5 |
| Sc | < 0.5 | Sm | < 0.5 |
| Ti | < 0.5 | Eu | < 0.5 |
| V | < 0.5 | Gd | < 0.5 |
| Cr | < 0.5 | Tb | < 0.5 |
| Mn | < 0.5 | Dy | < 0.5 |
| Fe | < 5 | Ho | < 0.5 |
| Co | < 0.5 | Er | < 0.5 |
| Ni | < 0.5 | Tm | < 0.5 |
| Cu | 3.9 | Yb | < 0.5 |
| Zn | 3.7 | Lu | < 0.5 |
| Ga | < 0.5 | Hf | < 0.5 |
| Ge | < 0.5 | Ta | < 0.5 |
| As | < 0.5 | W | < 0.5 |
| Se | < 0.5 | Re | < 0.5 |
| Rb | < 0.5 | Os | < 0.5 |
| Sr | < 0.5 | Ir | < 0.5 |
| Y | < 0.5 | Pt | < 0.5 |
| Zr | < 0.5 | Au | < 0.5 |
| Nb | < 0.5 | Hg | < 0.5 |
| Mo | < 0.5 | Tl | < 0.5 |
| Ru | < 0.5 | Pb | < 0.5 |
| Rh | 2.7 | Bi | < 0.5 |
| Pd | < 0.5 | Th | < 0.5 |
| Ag | < 0.5 | U | < 0.5 |
| Cd | < 0.5 | | |

$MA_2Pb_3I_8 \cdot 2\,DMF$ $MA : CH_3NH_3^+$

Cross Section

Surface

Example 7   Reference Example 2

Intermediate crystals: Small
W: ca.50 nm, L: ca.500 nm

Thickness of Intermediate Layer: 412-456 nm

Flatness: ±8-40 nm in 500 nm width

**Intermediate crystals: Large
W: > 500 nm, L: > 1000 nm**

COMPLEX AND PEROVSKITE MATERIAL, AND PEROVSKITE-TYPE SOLAR CELL USING COMPLEX OR PEROVSKITE MATERIAL

TECHNICAL FIELD

The present invention relates to a complex and a perovskite material, as well as a perovskite solar cell comprising the complex or the perovskite material.

BACKGROUND ART

In recent years, solar photovoltaic generation has been attracting attention as clean energy, and the development of solar cells has progressed. As an example, a solar cell having a light-absorbing layer made of a perovskite material has been increasingly attracting attention as a next-generation solar cell that can be produced at low cost. For example, Non-Patent Document 1 discloses a solution-type solar cell having a light-absorbing layer made of a perovskite material. Further, Non-Patent Document 2 reports that a solid-state perovskite solar cell ensures high efficiency.

As methods for forming a perovskite layer, which is a light-absorbing layer of a perovskite solar cell, three major methods, i.e., a solution method (e.g., Non-Patent Documents 3 and 4), a vapor deposition method (e.g., Non-Patent Document 5), and a solution and vapor method (e.g., Non-Patent Document 6), have been known. As the solution method, a one-solution method (e.g., Non-Patent Document 3) in which a solution obtained by mixing $PbI_2$ with $CH_3NH_3I$ (may hereinafter be referred to as "MAI") at 1:1 to 3 (molar ratio) is applied by spin coating, and an organic solvent such as toluene is added thereto dropwise, followed by heating; and a two-step method (e.g., Non-Patent Document 4) in which heating is performed after spin coating of $PbI_2$, followed by immersion in a solution of $CH_3NH_3I$, have been known.

In particular, since the solution method can be applied for a printing method, this method is expected to enable production of a high-efficiency perovskite solar cell at lower cost. By using, in particular, the one-solution method, it becomes possible to form a flatter perovskite layer (light-absorbing layer), and thereby improve the solar cell characteristics. Therefore, the study and development of this technique for practical use have been carried out throughout the world.

CITATION LIST

Non-Patent Documents

Non-Patent Document 1: Journal of the American Chemical Society, 2009, 131, 6050-6051.
Non-Patent Document 2: Science, 2012, 388, 643-647.
Non-Patent Document 3: Nature Photonics, 2013, 7, 486-491.
Non-Patent Document 4: Nature, 2013, 499, 316-319.
Non-Patent Document 5: Nature, 2013, 501, 395-398.
Non-Patent Document 6: Journal of the American Chemical Society, 2014, 136, 622.

SUMMARY OF INVENTION

Technical Problem

However, when the previously known one-solution method is employed, in a general known method, the material utilization efficiency is insufficient when $PbCl_2$ and MAI are used at a ratio of 1:3 (molar ratio) to obtain a $CH_3NH_3PbI_3$ perovskite material, and impurities ($CH_3NH_3I$, $CH_3NH_3Cl$, $PbCl_2$, etc.) remain in the layer. Further, a different condition, for example, use of $PbI_2$ and $CH_3NH_3I$ at a stoichiometric ratio of 1:3(1:>1), from the ratio (1:1) in the generated perovskite material, must be used. In all cases having these problems, the material purity of the generated perovskite layer decreases, thus resulting in poor reproducibility of the solar cell characteristics. Further, when the previously known one-solution method is used, the hysteresis in the measurement of solar cell characteristics is large; as a result, it becomes difficult to accurately evaluate the solar cell characteristics, and the cells more easily degrade. Further, in this case, the reproducibility of the solar cell characteristics, including photoelectric conversion efficiency, was also poor, and the values were insufficient.

Therefore, an object of the present invention is to provide a perovskite precursor (complex) capable of decreasing the hysteresis and improving the solar cell characteristics in the application to a perovskite layer, while ensuring desirable reproducibility.

Solution to Problem

The inventors of the present invention conducted extensive research in light of the above problems, and found that it becomes possible to decrease the hysteresis and improve the solar cell characteristics while ensuring desirable reproducibility when a perovskite layer is formed from a complex of a compound having a predetermined composition and a dimethylformamide molecule. Further, the present inventors also found that desirable power conversion efficiency (PCE) and internal quantum efficiency (IQE) can be obtained by using a film formed of a perovskite precursor in which a complex of needle-like microcrystal has a predetermined orientation, or a perovskite material substantially free from lead halide. The present inventors conducted further study based on such findings, and completed the present invention. More specifically, the present invention encompasses the following structures.

Item 1. A complex comprising:
one or more of the compound represented by general formula (1):

wherein R is a cation represented by $R^1NH_3^+$ (wherein $R^1$ represents a univalent substituted or unsubstituted hydrocarbon group), or the following formula:

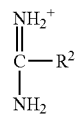

(wherein $R^2$ represents a hydrogen atom, or a univalent substituted or unsubstituted hydrocarbon group); X is the same or different, and each represents a halogen atom; n1 is 0.8 to 1.2; and m1 is 2.8 to 3.2,
or the compound represented by general formula (2):

wherein R and X are as defined above; n2 is 2.8 to 3.2; and m2 is 7.7 to 8.3.

Item 1-1. The complex according to Item 1, wherein $R^1$ is a substituted or unsubstituted alkyl group.

Item 1-2. The complex according to Item 1 or 1-1, wherein $R^2$ is a hydrogen atom, or a substituted or unsubstituted alkyl group.

Item 1-3. The complex according to any one of Items 1 to 1-2, wherein $R^2$ is a $C_{1-10}$ alkyl group.

Item 2. The complex according to any one of Items 1 to 1-3, wherein the complex is represented by general formula (1A):

$$RPb_{n1}X_{m1} \cdot (k1)DMF \quad (1A)$$

wherein R, X, n1 and m1 are as defined above; DMF represents dimethylformamide; and k1 is 0.8 to 2.2, or general formula (2A):

$$R_2Pb_{n2}X_{m2} \cdot (k2)DMF \quad (2A)$$

wherein R, X, n2, m2 and DMF are as defined above; and k2 is 1.8 to 2.2.

Item 2-1. The complex according to any one of Items 1 to 2, wherein R is a cation represented by $CH_3NH_3^+$ or

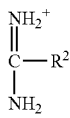

wherein $R^2$ is a hydrogen atom, or a univalent substituted or unsubstituted hydrocarbon group.

Item 3. The complex according to any one of Items 1 to 2-1, wherein X is an iodine atom.

Item 4. The complex according to any one of Items 1 to 3, wherein the complex is a needle-like crystal.

Item 5. The complex according to any one of Items 1 to 4, wherein the complex is a perovskite precursor.

Item 6. A production method for producing the complex according to any one of Items 1 to 5, the method comprising the step of:
dissolving the compound represented by general formula (3):

$$PbX_2$$

(wherein X is as defined above),
and the compound represented by general formula (4):

$$RX$$

(wherein R and X are as defined above)
in a first organic solvent containing dimethylformamide.

Item 7. The production method according to Item 6, wherein the first organic solvent further comprises dimethylsulfoxide, and the content ratio of dimethylformamide to dimethylsulfoxide is such that dimethylformamide:dimethylsulfoxide=4.0 or more:1.0 (molar ratio).

Item 8. The production method according to Item 6 or 7, comprising the step of:
adding a second organic solvent after the dissolving step.

Item 8-1. The production method according to Item 8, wherein the second organic solvent is a poor solvent.

Item 9. The production method according to Item 8 or 8-1, wherein the ratio of the amount of the first organic solvent to be used to the amount of the second organic solvent to be added is such that the second organic solvent: the first organic solvent=0.05 to 2.0:1.0 (volume ratio).

Item 10. A film comprising the complex according to any one of Items 1 to 5.

Item 11. A film comprising a perovskite precursor in which a needle-like microcrystal is oriented substantially in parallel, the film thickness is in a range of 100 to 1000 nm, and the surface flatness measured by a scanning electron microscope is such that the height difference in a range of 500 nm×500 nm in the horizontal direction is 50 nm or less,
the perovskite precursor comprising a complex comprising:
one or more of the compound represented by general formula (1):

$$RPb_{n1}X_{m1} \quad (1)$$

wherein R is a cation represented by $R^1NH_3^+$ (wherein $R^1$ represents a univalent substituted or unsubstituted hydrocarbon group), or the following formula:

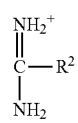

(wherein $R^2$ represents a hydrogen atom, or a univalent substituted or unsubstituted hydrocarbon group); X is the same or different, and each represents a halogen atom; n1 is 0.8 to 1.2; and m1 is 2.8 to 3.2,
or the compound represented by general formula (2):

$$R_2Pb_{n2}X_{m2} \quad (2)$$

wherein R and X are as defined above; n2 is 2.8 to 3.2; and m2 is 7.7 to 8.3;
and one or more solvent molecules.

Item 12. A production method for producing the film according to Item 10 or 11, the method comprising the step of:
dissolving the compound represented by general formula (3):

$$PbX_2$$

(wherein X is as defined above), and
the compound represented by general formula (4):

$$RX$$

(wherein R and X are as defined above)
in a third organic solvent; then applying the solution to a substrate; and thereafter adding a fourth organic solvent dropwise to the solution.

Item 13. A perovskite material represented by general formula (1):

$$RPb_{n1}X_{m1} \quad (1)$$

wherein R is a cation represented by $R^1NH_3^+$ (wherein $R^1$ represents a univalent substituted or unsubstituted hydrocarbon group), or the following formula:

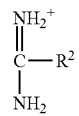

(wherein $R^2$ represents a hydrogen atom, or a univalent substituted or unsubstituted hydrocarbon group); X is the same or different, and each represents a halogen atom; n1 is 0.8 to 1.2; and m1 is 2.8 to 3.2, or general formula (2):

$$R_2Pb_{n2}X_{m2} \quad (2)$$

wherein R and X are as defined above; n2 is 2.8 to 3.2; and m2 is 7.7 to 8.3, the perovskite material being substantially free from the lead halide represented by general formula (3):

$PbX_2$ wherein X is as defined above.

Item 14. The perovskite material according to Item 13, wherein a major component is formed of grains of 10 nm or more, when surface observation is performed by a scanning electron microscope.

Item 15. A production method for producing a perovskite material, comprising the step of heating the complex according to any one of Items 1 to 5.

Item 16. A production method for producing the perovskite material according to Item 13 or 14, the method comprising the step of dissolving the compound represented by general formula (3):

$PbX_2$ (wherein X is as defined above),
and the compound represented by general formula (4):

RX (wherein R and X are as defined above)
in a third organic solvent, followed by heating.

Item 16-1. The production method according to Item 15, wherein the heating is annealing.

Item 17. A perovskite layer comprising the complex according to any one of Items 1 to 5, the film according to Item 10 or 11, or the perovskite material according to Item 12 or 13.

Item 18. The perovskite layer according to Item 17, wherein the needle-like microcrystal is oriented substantially in parallel, the film thickness is in a range of 200 to 500 nm, and the surface flatness measured by a scanning electron microscope is such that the height difference in a range of 500 nm×500 nm in the horizontal direction is 50 nm or less.

Item 19. A production method for producing a perovskite layer using the complex according to any one of Items 1 to 5, the method comprising the step of:
dissolving the complex in a third organic solvent, then applying the resulting solution to a substrate, and thereafter adding a fourth organic solvent dropwise to the solution, followed by heating.

Item 20. A production method for producing a perovskite layer using the film according to Item 10 or 11, the method comprising the step of:
heating the film.

Item 21. A production method for producing a perovskite layer using the perovskite material according to Item 12 or 13, the method comprising the step of:
dissolving the compound represented by general formula (3):

$PbX_2$ (wherein X is as defined above),
and the compound represented by general formula (4):

RX (wherein R and X are as defined above)
in a third organic solvent, then applying the solution to a substrate, and thereafter adding a fourth organic solvent dropwise to the solution, followed by heating.

Item 21-1. The production method according to any one of Items 19 to 21, wherein the heating is annealing.

Item 21-2. The production method according to Item 21 or 21-1, wherein the fourth organic solvent is a poor solvent.

Item 21-3. The production method according to Item 21-2, wherein the poor solvent is aromatic hydrocarbon.

Item 22. A perovskite solar cell comprising the complex according to any one of Items 1 to 5, the film according to Item 10 or 11, or the perovskite material according to Item 12 or 13.

Item 23. A perovskite solar cell comprising the perovskite layer according to Item 17 or 18.

Item 24. The perovskite solar cell according to Item 22 or 23, wherein the perovskite solar cell has power conversion efficiency (PCE) of 20% or more.

Item 25. The perovskite solar cell according to any one of Items 22 to 24, wherein the perovskite solar cell has an internal quantum efficiency (IQE) of 90% or more.

Advantageous Effects of Invention

The complex of the present invention is capable of producing a highly pure perovskite material, and is also capable of decreasing the hysteresis and improving the solar cell characteristics in the application to a perovskite layer, while ensuring desirable reproducibility. For some of the complexes of the present invention, accurate setting of the stoichiometric ratio of the respective constituents upon conversion into a perovskite material is easy.

Further, the present invention also makes it possible to provide a perovskite solar cell with desirable power conversion efficiency (PCE) and desirable internal quantum efficiency (IQE) by using a film formed of a perovskite precursor in which a complex of needle-like microcrystal has a predetermined orientation, or a perovskite material substantially free from lead halide.

BRIEF DESCRIPTION OF DRAWINGS

FIG. 1 shows the results of ICP Mass of the $MAPbI_3 \cdot DMF$ complex obtained in Example 1.

FIG. 4 shows the results of ICP Mass of the $FAPbI_3 \cdot 2DMF$ complex obtained in Example 2.

FIG. 11 also shows an XRD spectrum of $MAPbI_3 \cdot DMF$ and $MA_2Pb_2I_8 \cdot 2DMF$ predicted from the single-crystal X-ray structure analysis data in Examples 1 and 3.

DESCRIPTION OF EMBODIMENTS

Figure 2:
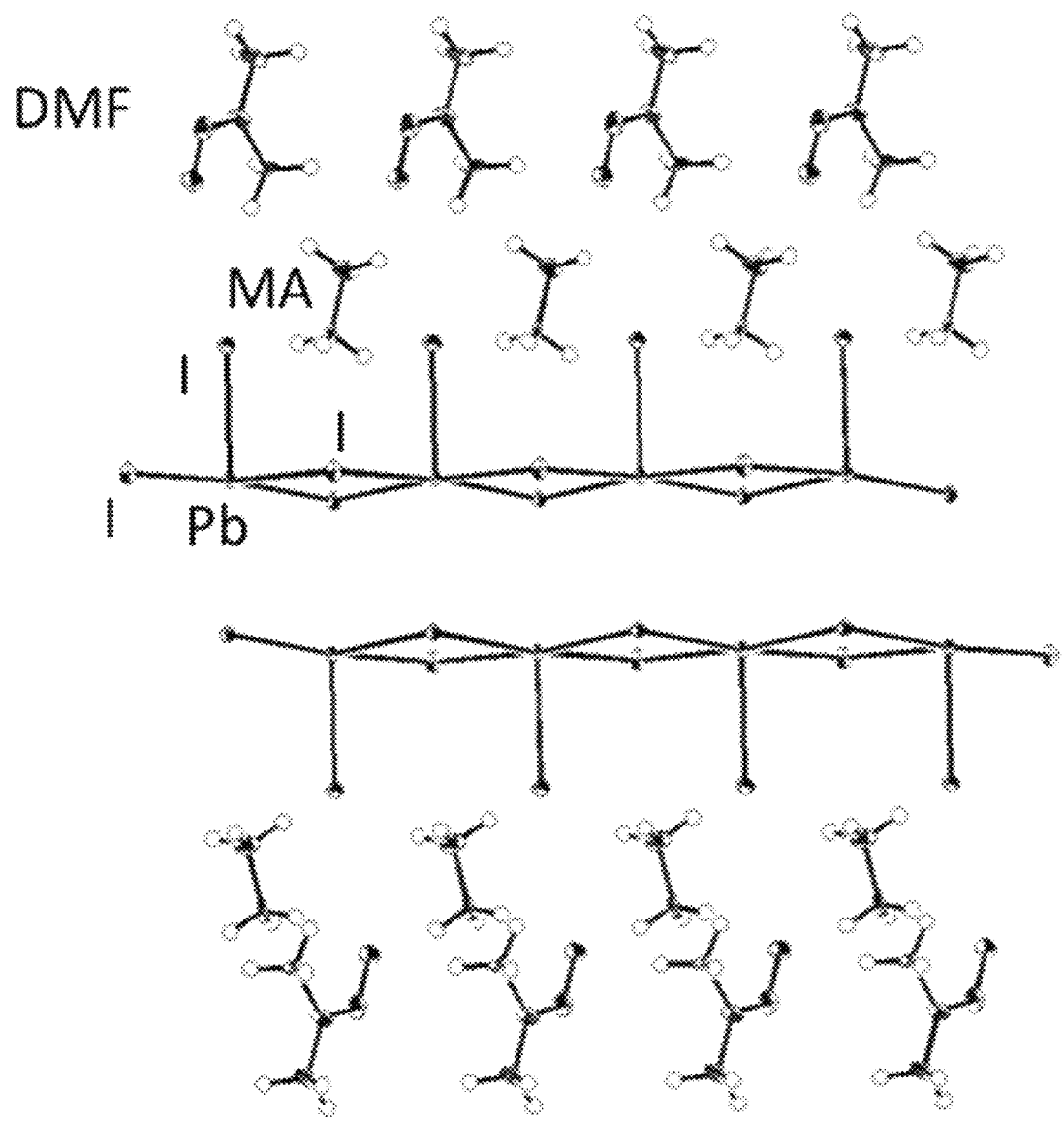
FIG. 2 shows X-ray crystal structure of the $MAPbI_3 \cdot DMF$ complex obtained in Example 1.

In this specification, examples of "univalent hydrocarbon group" include alkyl group, aryl group, aralkyl group, and the like.

In this specification, the "alkyl group" is preferably a $C_{1-20}$ linear, branched or cyclic alkyl group. Examples of alkyl group include methyl group, ethyl group, n-propyl group, 2-propyl group, n-butyl group, 1-methylpropyl group, 2-methylpropyl group, tert-butyl group, n-pentyl group, 1-methylbutyl group, 1-ethylpropyl group, tert-pentyl group, 2-methylbutyl group, 3-methylbutyl group, 2,2-dimethylpropyl group, n-hexyl group, 1-methylpentyl group, 1-ethylbutyl group, 2-methylpentyl group, 3-methylpentyl group, 4-methylpentyl group, 2-methylpentane-3-yl group, 3,3-dimethylbutyl group, 2,2-dimethylbutyl group, 1,1-dimethylbutyl group, 1,2-dimethylbutyl group, 1,3-dimethylbutyl group, 2,3-dimethylbutyl group, 1-ethylbutyl group, 2-ethylbutyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group, n-icosyl group, cyclopropyl group, cyclobutyl group, cyclopentyl group, cyclohexyl group, and the like.

In this specification, the "aryl group" is preferably a $C_{6-20}$ aryl group. Examples of the aryl group include phenyl group, indenyl group, pentalenyl group, naphthyl group, azulenyl group, fluorenyl group, phenanthrenyl group, anthracenyl group, acenaphthylenyl group, biphenylenyl group, naphthacenyl group, pyrenyl group, and the like.

In this specification, the "aralkyl group" is preferably a $C_{7-20}$ aralkyl group. Specific examples of aralkyl group include benzyl group, phenethyl group, 1-phenylpropyl group, 2-phenylpropyl group, 3-phenylpropyl group, 1-phenylbutyl group, 2-phenylbutyl group, 3-phenylbutyl group, 4-phenylbutyl group, 1-phenylpentylbutyl group, 2-phenylpentylbutyl group, 3-phenylpentylbutyl group, 4-phenylpen- tylbutyl group, 5-phenylpentylbutyl group, 1-phenylhexylbutyl group, 2-phenylhexylbutyl group, 3-phenylhexylbutyl group, 4-phenylhexylbutyl group, 5-phenylhexylbutyl group, 6-phenylhexylbutyl group, 1-phenylheptyl group, 1-phenyloctyl group, 1-phenylnonyl group, 1-phenyldecyl group, 1-phenylundecyl group, 1-phenyldodecyl group, 1-phenyltridecyl group, 1-phenyltetradecyl group, and the like.

In this specification, the "alkyl group," "aryl group," and "aralkyl group" may have one or more substituents. Examples of the substituents include the aforementioned univalent hydrocarbon groups, halogen atom, —$OR^{1a}$ (wherein $R^{1a}$ is a hydrogen atom or the aforementioned univalent hydrocarbon group), —$SR^{1b}$ (wherein $R^{1b}$ is a hydrogen atom or the aforementioned univalent hydrocarbon group), a nitro group, an amino group, a cyano group, a sulfo group, a carboxy group, a carbamoyl group, an aminosulfonyl group, an oxo group, and the like. In the case of having substituents, the number of substituents is not particularly limited, and is preferably 10 or less, more preferably 5 or less, further preferably 3 or less.

In this specification, examples of the "halogen atom" include fluorine atom, chlorine atom, bromine atom, iodine atom, and the like.

1. Complex

The complex of the present invention is a complex comprising one or more of the compound represented by general formula (1):

wherein R is a cation represented by $R^1NH_3^+$ (wherein $R^1$ represents a univalent substituted or unsubstituted hydrocarbon group), or the following formula:

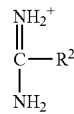

(wherein $R^2$ represents a hydrogen atom, or a univalent substituted or unsubstituted hydrocarbon group); X is the same or different, and each represents a halogen atom; n1 is 0.8 to 1.2; and m1 is 2.8 to 3.2, or the compound represented by general formula (2):

wherein R and X are as defined above; n2 is 2.8 to 3.2; and m2 is 7.7 to 8.3, and one or more dimethylformamide molecules.

With such a structure, by applying the solution of the complex of the present invention (e.g., by spin coating) and adding thereon an organic solvent such as toluene dropwise, followed by heating in accordance with the previously known solution method, it is possible to form a perovskite layer for a perovskite solar cell. In this method, since the complex of the present invention is easily dissolved in an organic solvent such as DMSO, it is possible to shorten the stirring time upon production of the solution of the complex of the present invention. Further, the use of these complexes as raw materials makes it possible to obtain a highly pure perovskite material.

The perovskite solar cell having such a perovskite layer is capable of decreasing the hysteresis compared with previously known techniques, thereby accurately evaluating the solar cell characteristics, and is also capable of inhibiting the degradation and improving the solar cell characteristics (in particular, photoelectric conversion efficiency) with desirable reproducibility. In the complex comprising the compound represented by general formula (1) and a dimethylformamide molecule, the molar ratio of R and Pb is 1:n1, and the perovskite material obtained by using the complex as a raw material also has an R and Pb molar ratio of 1:n1. Therefore, the complex represented by general formula (1) easily enables accurate setting of the stoichiometric ratio of the respective constituents upon conversion into a perovskite material.

In general formulas (1) and (2), R is a cation represented by $R^1NH_3^+$ or:

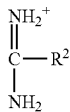

(wherein $R^2$ represents a hydrogen atom or a univalent substituted or unsubstituted hydrocarbon group). The univalent hydrocarbon group represented by $R^1$ and $R^2$ is preferably a $C_{1-10}$ alkyl group, a $C_{6-20}$ aryl group, or a $C_{7-12}$ aralkyl group; more preferably a $C_{1-6}$ alkyl group or a $C_{6-14}$ aryl group; and further preferably a $C_{1-4}$ alkyl group, in terms of allowing the perovskite material comprising the complex of the present invention to easily have a three-dimensional structure, absorb light in a wider wavelength range, and easily have improved power conversion efficiency (PCE) and internal quantum efficiency (IQE). For the same reason, as the $R^1$ and $R^2$, an alkyl group is preferable, a linear or branched alkyl group is more preferable, and a linear alkyl group is further preferable. In particular, a methyl group is most preferable.

With regard to $R^1$ and $R^2$, $R^1$ is preferably a methyl group and $R^2$ is preferably a hydrogen atom in terms of allowing the perovskite material comprising the complex of the present invention to easily have a three-dimensional structure, absorb light in a wider wavelength range, and easily have improved power conversion efficiency (PCE) and internal quantum efficiency (IQE).

More specifically, R is $CH_3NH_3^+$, or

In general formulas (1) and (2), "Pb" means a Pb cation that constitutes the B site when a perovskite material is obtained by using the complex of the present invention as a raw material.

In general formulas (1) and (2), the halogen atom represented by X is preferably iodine atom or bromine atom in terms of ensuring longer wavelength light absorption, ensuring a high short-circuit current density, and easily improving the power conversion efficiency (PCE) and the internal quantum efficiency (IQE). In particular, all of X are preferably iodine atoms.

In general formula (1), n1 is 0.8 to 1.2, and preferably 0.9 to 1.1 in terms of easily producing a perovskite material, and easily improving the power conversion efficiency (PCE) and the internal quantum efficiency (IQE).

In general formula (1), m1 is 2.8 to 3.2, and preferably 2.9 to 3.1 in terms of easily producing a perovskite material, and easily improving the power conversion efficiency (PCE) and the internal quantum efficiency (IQE).

In general formula (2), n2 is 2.8 to 3.2, and preferably 2.9 to 3.1 in terms of easily producing a perovskite material, and easily improving the power conversion efficiency (PCE) and the internal quantum efficiency (IQE).

In general formula (2), m2 is 7.7 to 8.3, and preferably 7.8 to 8.2 in terms of easily producing a perovskite material, and easily improving the power conversion efficiency (PCE) and the internal quantum efficiency (IQE).

Preferable examples of the compounds represented by general formula (1) or general formula (2) satisfying such conditions include $CH_3NH_3PbI_3$ (may hereinafter be referred to as "MAPbI$_3$"), $CH(NH_2)_2PbI_3$ (may hereinafter be referred to as "FAPbI$_3$"), $(CH_3NH_3)_2Pb_3I_8$ (may hereinafter be referred to as "MA$_2$Pb$_3$I$_8$"), and the like.

Further, the number of dimethylformamide molecules in the complex of the present invention is not particularly limited. For example, the complex may comprise a single molecule, or two or more molecules. Such a complex of the present invention is preferably the complex represented by (1A):

$$RPb_{n1}X_{m1}\cdot(k1)DMF \qquad (1A)$$

(wherein R, X, n1 and m1 are as defined above; DMF represents dimethylformamide; and k1 is 0.8 to 2.2), or the compound represented by general formula (2A):

$$R_2Pb_{n2}X_{m2}\cdot(k2)DMF \qquad (2A)$$

(wherein R, X, n2, m2 and DMF are as defined above; and k2 is 1.8 to 2.2).

In general formula (1A), k1 is 0.8 to 2.2, and preferably 0.9 to 2.1 in terms of easily producing a perovskite material, and easily improving the power conversion efficiency (PCE) and the internal quantum efficiency (IQE).

In general formula (1), k2 is 1.8 to 2.2, and preferably 1.9 to 2.1 in terms of easily producing a perovskite material, and easily improving the power conversion efficiency (PCE) and the internal quantum efficiency (IQE).

Preferable examples of such a complex of the present invention include $CH_3NH_3PbI_3\cdot DMF$ (may hereinafter be referred to as "MAPbI$_3\cdot$DMF"), $CH(NH_2)_2PbI_3\cdot 2DMF$ (may hereinafter be referred to as "FAPbI$_3\cdot$2DMF"), $(CH_3NH_3)_2Pb_3I_8\cdot 2DMF$ (may hereinafter be referred to as "MA$_2$Pb$_3$I$_8\cdot$2DMF"), and the like.

The complex of the present invention satisfying such conditions is more easily obtained as a needle-like microcrystal. The needle-like microcrystal preferably has a width (diameter) of 10 to 100 nm (in particular, 20 to 80 nm) and a length of 100 to 1000 nm (in particular, 200 to 800 nm). When the complex of the present invention is formed on a substrate as a film, the complex is oriented in the horizontal direction with respect to the substrate. Thus, a substantially flat film is obtained. In the present invention, a "substantially flat film" means a film having a flatness measured by a scanning electron microscope such that the height difference in a range of 500 nm×500 nm in the horizontal direction is 50 nm or less.

The complex of the present invention satisfying such conditions enables production of a perovskite material by desorption of the coordinate-bonded dimethylformamide molecules. More specifically, the complex of the present invention may be used as a perovskite precursor. Further, these complexes may be used as a precursor of a perovskite material having a high element purity, as shown in the Examples, thereby producing a highly pure perovskite material. Further, in the complex represented by general formula (1A), the molar ratio of R and Pb is 1:n1, and the perovskite material obtained by using the complex as a raw material also has an R and Pb molar ratio of 1:n1. Therefore, the complex represented by general formula (1A) easily enables accurate setting of the stoichiometric ratio of the respective constituents upon conversion into a perovskite material.

2. Method for Producing the Complex

The method for producing the complex of the present invention is not particularly limited; the complex of the present invention may be produced, for example, by a method comprising the step of dissolving the compound represented by general formula (3):

$$PbX_2$$

(wherein X is as defined above)
and the compound represented by general formula (4):

$$RX$$

(wherein R and X are as defined above)
in a first organic solvent containing dimethylformamide.

In general formulas (3) and (4), R and X are as defined above. The preferable examples are also the same as above.

Preferable examples of the compound represented by general formula (3) include $PbI_2$ and the like. Preferable examples of the compound represented by general formula (4) include $CH_3NH_3I$, $CH(NH_2)_2I$, and the like.

The amount of the compound represented by general formula (4) to be added is not particularly limited. In terms of easy production of the complex of the present invention, the amount of the compound represented by general formula (4) is preferably 0.5 to 2.0 mole, more preferably 0.8 to 1.3 mole, per mole of the compound represented by general formula (3).

As described above, the complex of the present invention is a complex comprising a compound having a predetermined composition and a dimethylformamide molecule. Therefore, the first organic solvent contains dimethylformamide (DMF). The first organic solvent may contain only dimethylformamide, or may contain dimethylformamide and one or more other organic solvents. Examples of other usable organic solvents include dimethylsulfoxide (DMSO), γ-butyrolactone, and the like. Of these, DMSO is preferable in terms of easy production of the complex of the present invention.

When the first organic solvent contains dimethylformamide and one or more other organic solvents, the ratio of the amount of dimethylformamide to the amount of other organic solvents (DMSO etc.) is preferably such that: dimethylformamide/other organic solvent (DMSO etc.)=4.0 or more/1.0 (molar ratio), more preferably 5.0 to 10.0/1.0 (molar ratio), in terms of easy production of the complex of the present invention.

When the compound represented by general formula (3) and the compound represented by general formula (4) are dissolved in the first organic solvent, the concentrations of these compounds are such that the concentration of the compound represented by general formula (3) is preferably 0.5 to 3.0 mol/L, more preferably 0.8 to 2.0 mol/L. Further, the concentration of the compound represented by general formula (4) is preferably 0.5 to 3.0 mol/L, more preferably 0.8 to 2.0 mol/L. When the process is followed by heating, the compounds may have slightly higher concentrations.

In the present invention, when the complex is formed as an intermediate of perovskite film generation, a second organic solvent may be added to the above solution during the film-forming step. By doing so, the second organic solvent is diffused, and the complex of the present invention comprising a small (diameter=about 10 to 100 nm, length=about 100 to 1000 nm) needle-like crystal is generated. When the obtained complex is formed as a film on the substrate, it is oriented in the horizontal direction due to, for example, the effects of the stress applied to the solution, thereby easily obtaining a substantially flat film. In contrast, when the second organic solvent is not added, the size of the needle-like crystal generated as an intermediate is large (diameter=200 nm or more, length=1500 nm or more), and it is not oriented in the horizontal direction. Thus, a substantially flat film is not easily obtained.

The second organic solvent is preferably a poor solvent in terms of ensuring sufficient diffusion of the second organic solvent, thus enabling easy production of the complex of the present invention. Specific examples include aromatic hydrocarbons such as toluene or benzene; substituted aromatic hydrocarbons such as chlorobenzene, ortho-dichlorobenzene, or nitrobenzene; ethers such as diethylether or tetrahydrofuran (THF); alcohols such as methanol, ethanol, isopropanol, butanol, or octanol; long-chain hydrocarbons such as hexane (in particular, $C_{4-10}$ hydrocarbon); pyridine; acetonitrile; and the like. These second organic solvents may be used alone, or in combinations of two or more. Of these, aromatic hydrocarbon is preferable in terms of easy production of the complex of the present invention. Toluene is more preferable.

The amount of the second organic solvent to be added is not particularly limited. In terms of ensuring sufficient diffusion of the second organic solvent, thus enabling easy production of the complex of the present invention, the ratio of the amount of the first organic solvent to be used to the amount of the second organic solvent to be added is such that the second organic solvent: the first organic solvent=0.05 to 2.0:1.0 (volume ratio), more preferably 0.1 to 1.3:1.0 (volume ratio).

When the second organic solvent is added, it is preferable to leave it unattended for a long time thereafter in terms of ensuring sufficient diffusion of the second organic solvent, thus enabling easy separation of the complex of the present invention. For example, it is preferable to leave it unattended for about 5 to 100 hours, in particular, 10 to 50 hours. In contrast, when the complex is generated by a film-forming step and is used as an intermediate of a perovskite film having high flatness and density, it is preferable to perform the addition of the second organic solvent in a short time, rapidly followed by an annealing process, in terms of controlling the drying of the solvent. For example, it is preferable to add the second organic solvent dropwise in 1 to 5 seconds at the end of the film-forming process by applying the solution of the first organic solvent by spin coating or the like, followed by the annealing process within 10 minutes.

Further, in the present invention, the solution may be heated. More specifically, it is possible to heat the solution of the compound represented by general formula (3) and the compound represented by general formula (4) obtained by dissolving them in the first organic solvent, or heat the solution of the compound represented by general formula (3) and the compound represented by general formula (4) obtained by dissolving them in the first organic solvent after the second organic solvent is added to the solution.

The heating temperature is not particularly limited; the heating temperature is preferably 30 to 100° C., more preferably 40 to 80° C., in terms of easy production of the complex of the present invention.

The complex of the present invention can thus be obtained. When the compound represented by general formula (3) and the compound represented by general formula (4) are dissolved in the first organic solvent constituted of only dimethylformamide and then the second organic solvent is added thereto, the complex represented by general formula (1A) is more easily yielded. When the compound represented by general formula (3) and the compound represented by general formula (4) are dissolved in the first organic solvent comprising dimethylformamide and one or more other organic solvents, and then the solution is heated, the complex represented by general formula (2A) is more easily yielded.

3. Film Constituted of the Complex

The complex of the present invention ensures significant flatness of the layer since the complex formed of a needle-like microcrystal is oriented in a substantially horizontal direction. It is also possible to, by using such a film, form a perovskite layer made of a perovskite material having a high element purity, as well as improving the power conversion efficiency (PCE) and the internal quantum efficiency (IQE) by the application thereof to a perovskite solar cell. In the present invention, the "substantially horizontal film" means that the angle formed by the surface of the film of the complex of the present invention and the center line of the needle-like crystal is 0 to 10° (in particular, 0 to 5°)

The complex used herein is not limited to only the above-described complex of the present invention. More specifically, a complex comprising the compound represented by general formula (1) or the compound represented by general formula (2), and a solvent molecule may be used. Examples of the solvent molecule include dimethylformamide, dimethylsulfoxide, and the like. Such a complex is preferably the complex represented by general formula (1A):

$$RPb_{n1}X_{m1}\cdot(k1)DMF \quad (1A)$$

(wherein R, X, n1, m1, k1, and DMF are as defined above), the complex represented by general formula (1B):

$$RPb_{n1}X_{m1}\cdot(k1)DMSO \quad (1B)$$

(wherein R, X, n1, m1, and k1 are as defined above; and DMSO represents dimethylsulfoxide), the complex represented by general formula (2A):

$$R_2Pb_{n2}X_{m2}\cdot(k2)DMF \quad (2A)$$

(wherein R, X, n2, m2, k2, and DMF are as defined above), or the compound represented by general formula (2B):

$$R_2Pb_{n2}X_{m2}\cdot(k2)DMSO \quad (2B)$$

(wherein R, X, n2, m2, k2, and DMSO are as defined above).

Preferable examples of such a complex include $CH_3NH_3PbI_3\cdot DMF$ (may hereinafter be referred to as "MAPbI$_3$.DMF"), $CH(NH_2)_2PbI_3\cdot 2DMF$ (may hereinafter be referred to as "FAPbI$_3$.2DMF"), $(CH_3NH_3)_2Pb_3I_8\cdot 2DMF$ (may hereinafter be referred to as "MA$_2$Pb$_3$I$_8$.2DMF"), $(CH_3NH_3)_2Pb_3I_8\cdot 2DMSO$ (may hereinafter be referred to as "MA$_2$Pb$_3$I$_8$.2DMSO"), and the like.

The film formed from a complex may be a layer formed only of the above complex, or a layer comprising a metal oxide such as meso titanium oxide, aluminum oxide, or the like and the complex, in terms of the adhesiveness with respect to the (positive hole) blocking layer when the film is made into a perovskite layer in a later step.

In the present invention, since mass production is possible by the roll-to-roll process, the mixed liquid is applied to a substrate preferably by spin coating, dip coating, screen printing method, roll coating, die coating method, transfer printing method, spray method, slit coating method, and the like; preferably by spin coating.

The substrate is not particularly limited insofar as it is capable of supporting the film to be formed. The material of the substrate is not particularly limited, and may be a known substrate insofar as the object of the present invention is not impaired. Both organic compounds and inorganic compounds may be used. For example, any of insulator substrates, semiconductor substrates, metal substrates, and conductive substrates (including conductive films) may be used. Further, substrates in which at least one kind of film selected from metal films, semiconductor films, conductive films, and insulating films is formed on a part of the surface or the entire surface thereof may also be suitably used.

Examples of metals constituting the metal film include one or more members selected from gallium, iron, indium, aluminum, vanadium, titanium, chromium, rhodium, nickel, cobalt, zinc, magnesium, calcium, silicon, yttrium, strontium and barium. Examples of the materials constituting the semiconductor film include elements such as silicon, germanium, and the like, compounds of the elements of Group-3 to Group-5, and Group 13 to Group 15 of the periodic table, metal oxides, metal sulfide, metal selenide, metal nitride, and the like. Examples of the materials constituting the conductive film include tin-doped indium oxide (ITO), fluorine-doped indium oxide (FTO), zinc oxide (ZnO), aluminum-doped zinc oxide (AZO), gallium-doped zinc oxide (GZO), tin oxide (SnO$_2$), indium oxide (In$_2$O$_3$), tungsten oxide (WO$_3$), and the like. Examples of the materials constituting the insulating film include aluminum oxide (Al$_2$O$_3$), titanium oxide (TiO$_2$), silicon oxide (SiO$_2$), silicon nitride (Si$_3$N$_4$), silicon oxynitride (Si$_4$O$_5$N$_3$), and the like. An insulating film constituted of an insulating oxide is preferable, and a titanium oxide film is more preferable. In the present invention, conductive films constituted of conductive oxides or insulating oxides are preferable. Tin-doped indium oxide (ITO) film, fluorine-doped indium oxide (FTO), titanium oxide (TiO$_2$), and the like are more preferable.

The shape of the substrate is not limited, and any shape is useful. Examples of the shape include flat plate, circular disk, and like plate shapes; as well as fibrous, rod-shaped, circular-column, square-column, tubular, spiral, spherical, and annular shapes. Porous structures are also useful. In the present invention, a plate-shaped substrate is preferable. The thickness of the substrate is not particularly limited in the present invention. The thickness is preferably 0.1 μm to 100 mm, more preferably 1 μm to 10 mm.

Such a film formed from the complex of the present invention is structured such that the needle-like microcrystal (complex) is oriented substantially in parallel. More specifically, the long-axis direction of the needle-like microcrystal is oriented in the substantially horizontal direction of the substrate. With such characteristics, when the film is converted into a perovskite layer in a later step, it is possible to provide a substantially flat and dense layer, which is also a layer made of a perovskite material having a high element purity. Further, it is possible to improve the power conversion efficiency (PCE) and the internal quantum efficiency (IQE) in its application to a perovskite solar cell. In the present invention, a needle-like microcrystal oriented "substantially in parallel" means that the angle formed by arbitrarily selected needle-like microcrystals is 0 to 10° (in particular, 0 to 5°).

The thickness of such a film formed from the complex of the present invention is in a range of 100 to 1000 nm, preferably in a range of 250 to 500 nm. Consequently, the light-absorbing efficiency and the exciton diffusion length are more easily balanced when a perovskite layer is formed in a later step, and the efficiency in the absorption of light reflected by a transparent electrode may be further improved. More specifically, the lower limit of the thickness of the film formed from the complex of the present invention is 100 nm or more (in particular, 250 nm or more), and the upper limit is 1000 nm or less (in particular, 500 nm or less). The thickness of the film formed from the complex of the present invention is measured using a cross-sectional scanning electron microscope (cross-sectional SEM) of the film made of the complex of the present invention.

Further, the flatness of the film formed from the complex of the present invention is such that the height difference of the film surface in a range of 500 nm×500 nm in the horizontal direction measured by a scanning electron microscope is 50 nm or less (−25 nm to +25 nm), more preferably 40 nm or less (−20 nm to +20 nm). Consequently, the light-absorbing efficiency and the exciton diffusion length are more easily balanced when a perovskite layer is formed in a later step, and the efficiency in the absorption of light reflected by a transparent electrode may further be improved. Regarding the flatness of the film, the reference point is an arbitrarily selected measurement point, the upper limit is the difference with respect to the largest thickness in the measurement range, and the lower limit is the difference with respect to the smallest thickness in the measurement range; the flatness of the film is measured using a cross-sectional scanning electron microscope (cross-sectional SEM) of the film made of the complex of the present invention.

The method for forming the film from the complex of the present invention is not particularly limited. For example, the film may be obtained by a method of dissolving the compound represented by general formula (3):

$$PbX_2$$

(wherein X is as defined above)
and the compound represented by general formula (4):

$$RX$$

(wherein R and X are as defined above)
in the third organic solvent, applying the solution to a substrate, and adding the fourth organic solvent dropwise to the solution. The application is preferably performed by the spin coating method. As a result, the fourth organic solvent is diffused, and a needle-like microcrystal generated as a small crystal (diameter=about 10 to 100 nm, length=about 100 to 1000 nm) is oriented in the horizontal direction, thereby easily obtaining a substantially flat film. In contrast, when the fourth organic solvent is not added, the size of the complex becomes large (diameter=200 nm or more, length=1500 nm or more), and is not oriented in the horizontal direction. Thus, a substantially flat film is not easily obtained.

The atmosphere upon the film formation is preferably a dry atmosphere, because prevention of moisture contamination during the formation of the perovskite layer (light-absorbing layer) in a later step enables production of a perovskite solar cell with desirable reproducibility and high efficiency; further, a dry inert gas atmosphere, such as a glove box or the like, is more preferable. Further, dehydration is preferably performed, and a solvent with a small moisture content is preferably used.

The solvents described later may be used as the third organic solvent and the fourth organic solvent. The same preferable examples, amounts, concentrations, etc., may also be employed.

4. Perovskite Material

The perovskite material of the present invention is a material represented by general formula (1):

$$RPb_{n1}X_{m1} \quad (1)$$

(wherein R, X, n1, and m1 are as defined above), or general formula (2):

$$R_2Pb_{n2}X_{m2} \quad (2)$$

(wherein R, X, n2, and m2 are as defined above),
and is substantially free from the lead halide represented by general formula (3):

$$PbX_2$$

(wherein X is as defined above).

In general formulas (1) and (3), R, X, n1, m1, n2, and m2 are as defined above. The same preferable examples, ranges, etc., may also be employed.

Examples of lead halide represented by general formula (3), which is substantially not contained in the perovskite material of the present invention, include $PbI_2$, $PbCl_2$, $PbBr_2$, and the like.

In the present invention, the state "substantially free from lead halide" means a state where the peak intensity of lead halide is less than 3%, preferably less than 1%, with respect to the peak intensity of the perovskite material, in an X-ray diffraction spectrum of the perovskite material of the present invention. With such characteristics, a perovskite solar cell comprising the perovskite material of the present invention is capable of further improving the power conversion efficiency (PCE) and the internal quantum efficiency (IQE).

In the perovskite material of the present invention, the major component is preferably constituted of grains of 10 nm or more when the surface is observed by a scanning electron microscope (SEM). This means, for example, that perovskite material is confirmed to have a major component constituted of grains of 10 nm or more when the film surface of the perovskite material is observed using an SEM image in an arbitrary range (1 to 10 μm square). The "major component constituted of grains of 10 nm or more" means a major component where grains of 10 nm or more can be confirmed in at least 50% area per unit area. By having the structure with such grains, a perovskite solar cell comprising the perovskite material of the present invention is capable of further improving the power conversion efficiency (PCE) and the internal quantum efficiency (IQE). In the present invention, the formation of perovskite material becomes more stable when a small crystal is formed, thereby obtaining a perovskite material with superior structural stability. Therefore, the material preferably has a plurality of needle-like or columnar projections of less than 1 μm, and more preferably has a plurality of needle-like or columnar projections of not less than 10 nm, and less than 1 μm. The grains are not particularly limited insofar as they have a size of 10 nm or more; the grains usually have a bedrock-like shape or a cubic shape. The size is preferably 100 nm to 10 μm.

5. Method for Producing Perovskite Material (1)

Since the complex of the present invention is a complex comprising one or more compounds having a predetermined composition and one or more dimethylformamide molecule, a perovskite material may be obtained by desorbing the dimethylformamide molecule.

More specifically, a perovskite material may be obtained by heating the complex of the present invention. The heating temperature is not particularly limited. In terms of easy production of perovskite material, the heating temperature is preferably 80 to 200° C., more preferably 90 to 150° C.

The perovskite material thus obtained has a composition represented by general formula (1) shown above.

6. Method for Producing Perovskite Material (2)

The perovskite material of the present invention described above may be obtained, for example, by dissolving the compound represented by general formula (3):

(wherein X is as defined above)
and the compound represented by general formula (4):

(wherein R and X are as defined above)
in the third organic solvent, followed by heating.

First, the method for dissolving the raw material compound may be performed in the same manner as that in "2. Method for Producing the Complex." The same preferable examples, conditions, etc., may also be employed. However, in this step, the third organic solvent is used instead of the first organic solvent. Examples of the third organic solvent used herein include DMSO, DMF, γ-butyrolactone, dimethylacetamide (DMA), 1,3-dimethyl-2-imidazolidinone, acetylacetone, tert-butylpyridine, dimethylethyleneurea (DMI), dimethylpropyleneurea (DMU), tetramethylurea (TMU), and the like. These solvents may be used alone, or in combinations of two or more. When a mixed solvent is used, a dimethylformamide complex may be obtained by setting the ratio of the amount of dimethylformamide to the amount of other organic solvents (DMSO etc.) to 4.0 or more/1.0 (molar ratio), or a dimethylsulfoxide complex may be obtained by setting the ratio of the amount of dimethylformamide to the amount of other organic solvents (DMSO etc.) to less than 4.0/1.0 (molar ratio). This step generally yields a complex as a precursor. In terms of easy formation of a more dense and flat perovskite layer, and further improvement in the solar cell characteristics (in particular, photoelectric conversion efficiency), the concentrations of the respective materials when they are dissolved in the third organic solvent are preferably adjusted so that the concentrations of the complexes to be produced fall within a range of 0.5 to 3.0 M, particularly in a range of 1.0 to 2.0 M.

By subsequently heating (in particular, annealing) the resulting mixture, it is possible to obtain the perovskite material of the present invention. The heating temperature is not particularly limited. In terms of easy production of the perovskite material of the present invention, the heating temperature is preferably 80 to 200° C., more preferably 90 to 150° C.

7. Perovskite Layer (Perovskite Layer for Perovskite Solar Cell) and Perovskite Solar Cell As described above, although the complex of the present invention is in the form of fine needle-like crystal, the film formed from the complex of the present invention is substantially flat. Further, when the complex of the present invention is heated to produce a perovskite material, the material has a substantially flat surface. Therefore, the perovskite material obtained by using the complex of the present invention or the film formed from the perovskite material of the present invention forms a flat perovskite layer, which is particularly useful as a perovskite layer of a perovskite solar cell ensuring improved solar cell characteristics (in particular, photoelectric conversion efficiency).

Further, by forming a perovskite layer from the film of the present invention or using the film of the perovskite material of the present invention as a perovskite layer, it is also possible to increase, in particular, the power conversion efficiency (PCE) and the internal quantum efficiency (IQE). Specifically, performance with a power conversion efficiency (PCE) of 20% or more and an internal quantum efficiency (IQE) of 90% or more (in particular, 95% or more), which has thus far not been achieved, may be obtained.

The perovskite solar cell of the present invention may have a structure similar to that of a known perovskite solar cell, except that it comprises the complex of the present invention, the film of the present invention, or a perovskite layer comprising the perovskite material of the present invention, as a perovskite layer (light-absorbing layer). For example, the perovskite solar cell of the present invention preferably comprises a transparent electrode, a (positive hole) blocking layer, an electron transport layer, a perovskite layer (light-absorbing layer), a positive hole transporting layer, and a metal electrode, in this order.

(7-1) Transparent Electrode

The transparent electrode serves as a support of the (positive hole) blocking layer, and also has a function of retrieving currents (electrons) from a perovskite layer (light-absorbing layer); therefore, the transparent electrode is preferably a conductive substrate. A transparent conductive layer with a light-transmissive property, which enables transmission of light contributing to the photoelectric conversion, is preferable.

Examples of the transparent conductive layer include tin-doped indium oxide (ITO) film, impurity-doped indium oxide ($In_2O_3$) film, impurity-doped zinc oxide (ZnO) film, fluorine-doped tin dioxide (FTO) film, and lamination films obtained by laminating these films.

The thickness of the transparent conductive layers is not particularly limited; the thickness is generally adjusted so that the resistance becomes 5 to 15 Ω/□.

The transparent conductive layer may be obtained by a known film-forming method according to the material subjected to the formation.

Further, the transparent conductive layer may be covered with a light-transmissive coating as necessary to be protected from external ambience.

Examples of the light-transmissive coating include fluororesin, polyvinyl chloride, polyimide, and like resin sheets; super white glass, soda-lime glass, and like inorganic sheets; and hybrid sheets obtained by combining these sheets.

The thickness of the light-transmissive coating is not particularly limited; the thickness is generally adjusted so that the resistance becomes 5 to 15 Ω/□.

(7-2) (Positive Hole) Blocking Layer

The (positive hole) blocking layer is a layer provided to prevent the leak of positive hole, inhibit the reverse current, thereby improving the solar cell characteristics (in particular, photoelectric conversion efficiency); and is preferably provided between the transparent electrode and the perovskite layer (light-absorbing layer). The (positive hole) blocking layer is preferably a layer made of a metal oxide such as titanium oxide, and more preferably a layer in which the surface of the transparent electrode has smooth and dense coating of an n-type semiconductor such as compact $TiO_2$. The term "dense" designates a state where the metal compound filling is at a higher density than that in the electron transport layer. Insofar as an electric connection is not made between the transparent electrode and the electron transport layer, pinholes, cracks, and the like may be present.

The thickness of the (positive hole) blocking layer is, for example, 5 to 300 nm. The thickness of the (positive hole) blocking layer is preferably 10 to 200 nm in terms of electron injection efficiency with respect to the electrode.

The (positive hole) blocking layer is formed on the transparent electrode. When a metal oxide is used for the (positive hole) blocking layer, the production may be performed by spray pyrolysis according to an existing method (e.g., Non-Patent Document 4, J. Phys. D: Appl. Phys. 2008, 41, 102002, etc.). For example, the production may be performed by spraying 0.01 to 0.40 M (in particular, 0.02 to 0.20 M) metal alkoxide (titanium di(isopropoxide)bis(acetylacetonate) or like titanium alkoxide) dissolved in alcohol (e.g., isopropyl alcohol etc.) to a transparent electrode placed on a hot plate heated to 200 to 550° C. (in particular, 300 to 500° C.).

Thereafter, by immersing the obtained substrate in an aqueous solution of titanium oxide ($TiO_2$ etc.), titanium alkoxide (titanium isopropoxide etc.), or titanium halide ($TiCl_4$ etc.), a film with superior density may be obtained.

The concentration of the aqueous solution is preferably 0.1 to 1.0 mM, more preferably 0.2 to 0.7 mM. Further, the immersion temperature is preferably 30 to 100° C., more preferably 50 to 80° C. Further, the heating is preferably performed at 200 to 1000° C. (in particular, 300 to 700° C.) for 5 to 60 minutes (in particular, 10 to 30 minutes).

(7-3) Electron Transport Layer

The electron transport layer is formed to increase the active surface area of the perovskite layer (light-absorbing layer), improve the photoelectric conversion efficiency, and facilitate electron collection. The electron transport layer is preferably formed on the (positive hole) blocking layer.

The electron transport layer is preferably a flat layer obtained by using an organic semiconductor material such as a fullerene derivative, more preferably a layer having a porous structure. Preferably, the porous structure is, for example, a structure in which granular, needle-like, tubular and columnar bodies are assembled to give a porous property as a whole. Further, the pore size is preferably on a nano scale. Because of the nano scale of the porous structure, it is possible to provide a porous electron transport layer capable of increasing the active surface area of the light-absorbing layer, improving the solar cell characteristics (in particular, photoelectric conversion efficiency), and ensuring superior electron collection.

The electron transport layer is preferably a layer made of a metal oxide such as titanium oxide or the like. When the metal compound is a semiconductor, the semiconductor may be used by being doped with a donor. Consequently, the electron transport layer serves as a window layer for allowing introduction into the perovskite layer (light-absorbing layer), and more efficient extraction of power obtained from the perovskite layer (light-absorbing layer).

The thickness of the electron transport layer is not particularly limited. In terms of easy electron collection from the perovskite layer (light-absorbing layer), the thickness is preferably about 10 to 300 nm, more preferably about 10 to 250 nm.

The electron transport layer may be obtained by a known film-forming method according to the material subjected to the formation. For example, the electron transport layer may be formed by applying 5 to 50 mass % (in particular, 10 to 30 mass %) of an titanium oxide paste dissolved in alcohol (e.g., ethanol, etc.) onto the (positive hole) blocking layer. The titanium oxide paste may be any known paste, or may be obtained from commercial suppliers. The application is preferably performed by the spin coating method. The application may be performed, for example, at about 15 to 30° C.

4. Perovskite Layer (Light-Absorbing Layer)

The perovskite layer (light-absorbing layer) of a perovskite solar cell serves to absorb light and transfer the excited electrons, thus performing photoelectric conversion. The perovskite layer (light-absorbing layer) is a perovskite material comprising the complex of the present invention, or a layer comprising the perovskite material of the present invention. This perovskite material is a compound having the composition represented by general formula (1). With this composition, it is possible to produce a significantly flat perovskite layer, thereby easily increasing the power conversion efficiency (PCE) and the internal quantum efficiency (IQE). In particular, by using a layer comprising the perovskite material of the present invention, it is possible to further improve the power conversion efficiency (PCE) and the internal quantum efficiency (IQE). The perovskite layer may be a layer made of a perovskite material having a high element purity.

In the present invention, since mass production is possible by the roll-to-roll process, the mixed liquid is preferably applied to a substrate by spin coating, dip coating, screen printing, roll coating, die coating, transfer printing, spray method, slit coating method, and the like; preferably by spin coating.

The substrate is not particularly limited insofar as it is capable of supporting the film to be formed. The material of the substrate is also not particularly limited insofar as the object of the present invention is not impaired, and a known substrate may be used. Both organic compounds and inorganic compounds may be used. For example, any of insulator substrates, semiconductor substrates, metal substrates, and conductive substrates (including conductive films) may be used. Further, substrates in which at least one kind of film selected from metal films, semiconductor films, conductive films, and insulating films is formed on a part of the surface or the entire surface may also be suitably used.

Examples of metals constituting the metal film include one or more kinds selected from gallium, iron, indium, aluminum, vanadium, titanium, chromium, rhodium, nickel, cobalt, zinc, magnesium, calcium, silicon, yttrium, strontium and barium.

Examples of the materials constituting the semiconductor film include elements such as silicon, germanium, and the like; compounds made of elements of Groups 3 to 5 and Groups 13 to 15 of the periodic table; metal oxides; metal sulfide; metal selenide; metal nitride; and the like. Examples of the materials constituting the conductive film include tin-doped indium oxide (ITO), fluorine-doped indium oxide (FTO), zinc oxide (ZnO), aluminum-doped zinc oxide (AZO), gallium-doped zinc oxide (GZO), tin oxide ($SnO_2$), indium oxide ($In_2O_3$), tungsten oxide ($WO_3$), and the like. Examples of the materials constituting the insulating film include aluminum oxide ($Al_2O_3$), titanium oxide ($TiO_2$), silicon oxide ($SiO_2$), silicon nitride ($Si_3N_4$), silicon oxynitride ($Si_4O_5N_3$), and the like. An insulating film constituted of an insulating oxide is preferable, and a titanium oxide film is more preferable. In the present invention, conductive films constituted of conductive oxides or insulating oxides are preferable. Tin-doped indium oxide (ITO) film, fluorine-doped indium oxide (FTO), titanium oxide ($TiO_2$), and the like are more preferable.

The shape of the substrate is not limited, and any shape is useful. Examples of the shape include flat plate, circular disk, and like plate shapes; as well as fibrous, rod-shaped, circular-column, square-column, tubular, spiral, spherical, and annular shapes. Porous structures are also useful. In the present invention, a plate-shaped substrate is preferable. The thickness of the substrate is not particularly limited in the present invention. The thickness is preferably 0.1 µm to 100 mm, more preferably 1 µm to 10 mm.

In the present invention, as described above, it is possible to form a perovskite layer (light-absorbing layer) on various substrates; however, it is easy to form a perovskite layer on the electron transport layer.

The perovskite layer may be a perovskite material obtained by using the complex of the present invention, or a layer formed only of the perovskite material of the present invention. Further, the perovskite layer may be a layer containing a metal oxide such as meso titanium oxide or aluminum oxide and a perovskite material, in view of the adhesiveness with respect to the (positive hole) blocking layer.

The thickness of the perovskite layer (light-absorbing layer) is preferably, for example, 50 to 1000 nm, more preferably 200 to 800 nm in terms of the balance between the light-absorbing efficiency and the exciton diffusion length, as well as the efficiency in the absorption of light reflected by a transparent electrode. The thickness of the perovskite layer (light-absorbing layer) of the present invention preferably falls in a range from 100 to 1000 nm, more preferably in a range from 250 to 500 nm. More specifically, the lower limit of the thickness of the perovskite layer (light-absorbing layer) of the present invention is 100 nm or more (in particular, 250 nm or more), and the upper limit is 1000 nm or less (in particular, 500 nm or less). The thickness of the perovskite layer (light-absorbing layer) of the present invention is measured using a cross-sectional scanning electron microscope (cross-sectional SEM) of the film made of the complex of the present invention.

Further, the flatness of the perovskite layer (light-absorbing layer) of the present invention is such that the height difference in the surface in a range of 500 nm×500 nm in the horizontal direction measured by a scanning electron microscope is 50 nm or less (−25 nm to +25 nm), more preferably 40 nm or less (−20 nm to +20 nm). Consequently, the light-absorbing efficiency and the exciton diffusion length are more easily balanced, and the efficiency in the absorption of light reflected by a transparent electrode may further be improved. The "flatness of the perovskite layer (light-absorbing layer)" is such that the reference point is an arbitrarily selected measurement point, the upper limit is the difference with respect to the largest thickness in the measurement range, and the lower limit is the difference with respect to the smallest thickness in the measurement range; and the flatness is measured using a cross-sectional scanning electron microscope (cross-sectional SEM) of the perovskite layer (light-absorbing layer) of the present invention.

The method for forming a film of a perovskite layer is not particularly limited. When a perovskite layer is formed from the complex of the present invention using, for example, the above-described one-solution method, the complex of the present invention is dissolved in the third organic solvent, and the resulting solution is applied to a substrate (in particular, to the electron transport layer); and then the fourth organic solvent is added to the solution dropwise, followed by heating. The application is preferably performed by the spin coating method. As a result, the fourth organic solvent is diffused, and a needle-like microcrystal generated as a small crystal (diameter=about 10 to 100 nm, length=about 100 to 1000 nm) is oriented in substantially the horizontal direction, thereby easily obtaining a substantially flat perovskite layer (light-absorbing layer). In contrast, when the fourth organic solvent is not added, the size of the complex becomes large (diameter=200 nm or more, length=1500 nm or more), and it is not oriented in the horizontal direction. Thus, a substantially flat perovskite layer (light-absorbing layer) is not easily obtained.

The atmosphere upon the formation of the film of the perovskite material is preferably a dry atmosphere, because prevention of moisture contamination during the formation of the perovskite layer (light-absorbing layer) enables production of a perovskite solar cell with desirable reproducibility and high efficiency; further, a dry inert gas atmosphere, such as a glove box or the like, is more preferable. Further, dehydration is preferably performed, and a solvent with a small moisture content is preferably used.

In terms of easy formation of a more dense and flat perovskite layer, and further improvement in the solar cell characteristics (in particular, photoelectric conversion efficiency), examples of the third organic solvent used herein include DMSO, DMF, γ-butyrolactone, dimethylacetamide (DMA), 1,3-dimethyl-2-imidazolidinone, acetylacetone, tert-butylpyridine, dimethylethyleneurea (DMI), dimethylpropyleneurea (DMU), tetramethylurea (TMU), and the like. These solvents may be used alone, or in combinations of two or more. When a mixed solvent is used, a dimethylformamide complex may be obtained by setting the ratio of the amount of dimethylformamide to the amount of other organic solvents (DMSO etc.) to 4.0 or more/1.0 (molar ratio), or a dimethylsulfoxide complex may be obtained by setting the ratio of the amount of dimethylformamide to the amount of other organic solvents (DMSO etc.) to less than 4.0/1.0 (molar ratio).

When dissolved in the third organic solvent, in terms of easy formation of a more dense and flat perovskite layer and further improvement in the solar cell characteristics (in particular, photoelectric conversion efficiency), the concentration of the complex of the present invention falls within a range of 0.5 to 3.0 M, particularly in a range of 1.0 to 2.0 M.

Examples of the fourth organic solvents to be added dropwise include aromatic hydrocarbons such as toluene or benzene; substituted aromatic hydrocarbons such as chlorobenzene, ortho-dichlorobenzene, or nitrobenzene; ethers such as diethylether or tetrahydrofuran (THF); alcohols such as methanol, ethanol, isopropanol, butanol, or octanol; long-chain hydrocarbons such as hexane (in particular, $C_{4-10}$ hydrocarbons); pyridine; acetonitrile; and the like, in terms of easy formation of a more dense and flat perovskite layer, and further improvement in the solar cell characteristics (in particular, photoelectric conversion efficiency). These solvents may be used alone, or in combinations of two or more. In terms of easy formation of a more dense and flat perovskite layer, and further improvement in the solar cell characteristics (in particular, photoelectric conversion efficiency), aromatic hydrocarbons are preferable, substituted benzenes are more preferable, and toluene is further preferable.

In terms of easy formation of a more dense perovskite layer, and further improvement in the solar cell characteristics (in particular, photoelectric conversion efficiency), the ratio of the amount of the third organic solvent to be used to the amount of the fourth organic solvent to be added is such that the fourth organic solvent/the third organic solvent=0.1 to 5.0/1.0 (volume ratio), more preferably 0.5 to 2.0/1.0 (volume ratio).

In terms of easy formation of a more dense perovskite layer and further improvement in the solar cell characteristics (in particular, photoelectric conversion efficiency), the heating temperature is such that the highest temperature is preferably 50 to 200° C., and more preferably 70 to 150° C. In terms of easy formation of a more dense perovskite layer and further improvement in the solar cell characteristics (in particular, photoelectric conversion efficiency), the heating time is preferably 5 to 120 minutes, more preferably 10 to 60 minutes.

In contrast, when a perovskite layer is formed by using the perovskite material or the film of the present invention, the perovskite layer is obtained by dissolving the compound represented by general formula (3):

(wherein X is as defined above)
and the compound represented by general formula (4):

(wherein R and X are as defined above)
in the third organic solvent, applying the solution to a substrate, adding the fourth organic solvent to the solution dropwise, followed by heating.

The method for dissolving the raw material compounds in the third organic solvent may be performed in the same manner as those in "3. Film Constituted of the Complex" and "6. Method for Producing Perovskite Material (2)." Preferable examples and conditions are also similar to those.

The application to the substrate is preferably performed by the spin coating method. As a result, the fourth organic solvent to be added dropwise in a later step is diffused, and a needle-like microcrystal generated as a small crystal (diameter=about 10 to 100 nm, length=about 100 to 1000 nm) is oriented in the horizontal direction, thereby easily obtaining a substantially flat perovskite layer. In contrast, when the fourth organic solvent is not added, the size of the complex becomes large (diameter=200 nm or more, length=1500 nm or more), and it is not oriented in the horizontal direction. Thus, a substantially flat perovskite layer is not easily obtained.

In this step, in terms of easily obtaining a flat perovskite layer having a large grain size, the fourth organic solvent is added before the heating (in particular, before the annealing). In particular, it is preferable to add the fourth organic solvent dropwise from above in the film-forming step (the application described above). The fourth organic solvent is not particularly limited, and is preferably a poor solvent in terms of the power conversion efficiency (PCE) and the internal quantum efficiency (IQE). Examples include aromatic hydrocarbons such as toluene or benzene; substituted aromatic hydrocarbons such as chlorobenzene, ortho-dichlorobenzene, or nitrobenzene; ethers such as diethylether or tetrahydrofuran (THF); alcohols such as methanol, ethanol, isopropanol, butanol, or octanol; long-chain hydrocarbons such as hexane (in particular, $C_{4-10}$ hydrocarbons); pyridine; acetonitrile; and the like. In the present invention, the fourth organic solvent is preferably an aromatic hydrocarbon, more preferably substituted benzene, and further preferably toluene.

The amount of the fourth organic solvent to be added is not particularly limited. In terms of easy production of the perovskite material of the present invention by ensuring sufficient diffusion of the fourth organic solvent, the ratio of the amount of the third organic solvent to be used to the amount of the fourth organic solvent to be added is such that the fourth organic solvent/the third organic solvent=0.05 to 2.0/1.0 (volume ratio), more preferably 0.1 to 1.3/1.0 (volume ratio).

The atmosphere upon the film formation is preferably a dry atmosphere, because prevention of moisture contamination during the formation of the perovskite layer (light-absorbing layer) enables production of a perovskite solar cell with desirable reproducibility and high efficiency; further, a dry atmosphere is preferable, and a dry inert gas atmosphere, such as a glove box or the like, is more preferable. Further, dehydration is preferably performed, and a solvent with a small moisture content is preferably used.

(7-5) Positive Hole Transport Layer

The positive hole transporting layer is a layer capable of charge transport. For example, conductors, semiconductors, organic positive hole transport materials, and the like may be used for the positive hole transporting layer. These materials may function as a positive hole transport material that receives positive hole from the perovskite layer (light-absorbing layer), and transports the positive hole. The positive hole transporting layer is formed on the perovskite layer (light-absorbing layer).

Examples of conductors and semiconductors include CuI, $CuInSe_2$, CuS, and like compound semiconductors containing monovalent copper; and GaP, NiO, CoO, FeO, $Bi_2O_3$, $MoO_2$, $Cr_2O_3$, and like compounds containing metals other than copper. Of these, in terms of efficiently receiving only positive hole and ensuring further higher positive hole mobility, semiconductors containing monovalent copper are preferable, and CuI is more preferable.

Examples of the organic positive hole transport material include poly-3-hexylthiophene (P3HT), polyethylenedioxythiophene (PEDOT), and like polythiophene derivatives; 2,2',7,7'-tetrakis-(N,N-di-p-methoxyphenylamine)-9,9'-spirobifluorene (spiro-OMeTAD) and like fluorene derivatives; polyvinyl carbazole and like carbazole derivatives; poly[bis (4-phenyl) (2,4,6-trimethylphenyl)amine] (PTAA) and like triphenylamine derivatives; diphenylamine derivatives; polysilane derivatives; polyaniline derivatives, and the like. Of these, in terms of efficiently receiving only positive hole and ensuring further higher positive hole mobility, triphenylamine derivatives, fluorene derivatives, and the like are preferable; and PTAA, spiro-OMeTAD, and the like are more preferable.

In order to further improve the positive hole transport characteristics, the positive hole transporting layer may contain lithium-bis(trifluoromethylsulfonyl)imide (LiTFSI), silver-bis(trifluoromethylsulfonyl)imide, trifluoromethylsulfonyloxy silver, $NOSbF_6$, $SbCl_5$, $SbF_5$, and like oxidants. Further, the positive hole transporting layer may contain t-butylpyridine (TBP), 2-picoline, 2,6-lutidine, and like basic compounds. The amounts of the oxidant and the basic compound are set according the previously known technique.

In terms of efficiently receiving only positive hole and ensuring further higher positive hole mobility, the thickness of the positive hole transporting layer is, for example, preferably 30 to 200 nm, more preferably 50 to 100 nm.

The film-forming in the formation of the positive hole transporting layer is preferably performed in a dry atmosphere. For example, the solution containing an organic positive hole transport material is preferably applied (e.g., by spin coating) onto a perovskite layer (light-absorbing layer) in a dry atmosphere, followed by heating at 30 to 150° C. (in particular, 50 to 100° C.).

(7-6) Metal Electrode

The metal electrode is formed on the positive hole transporting layer by being oppositely disposed with respect to the transparent electrode, thereby enabling charge exchange with the positive hole transporting layer.

The metal electrode may be formed from a known material used in the related technical field. Examples include platinum, titanium, stainless steel, aluminum, gold, silver, nickel, and like metals; and alloys of these metals.

Of these, in terms of enabling electrode formation in a dry atmosphere, the material of the metal electrode is preferably a material that enables electrode formation by vapor deposition or the like.

Perovskite solar cells having a structure other than the above layer structure may also be produced by a similar method.

EXAMPLES

The present invention is explained below in detail with reference to Examples etc. However, the present invention is not limited to these Examples. The X-ray structural analysis was performed using Sheldrick, G.M. SHELX-97, Program for the Refinement of Crystal Structures; University of Goettingen: Goettingen, Germany, 1997.

Examples 1 to 4, and Comparative Example 1:
Complex Example 1: $MAPbI_3$.DMF Complex A solution obtained by dissolving $PbI_2$ (2.305 g, 5.0 mmol) and methylammonium iodide (MAI; $CH_3NH_3I$; 795 mg, 5.0 mmol) in dimethylformamide (DMF; 5.0 mL, corresponding to $MAPbI_3$ 1.0 M) was placed in a screw tube. As a cushion layer, a few drops of DMF was placed on the solution by being slid down the wall of the screw tube. A poor solvent (toluene) was slowly placed thereon so that the volume ratio of the DMF layer and the poor solvent layer became 1:1; and a lid was placed on the container, followed by being kept still at room temperature. The solvent was diffused after about one day, and a colorless, needle-like crystal was generated. The crystal was collected by filtration, and dried under reduced pressure at room temperature for 20 minutes, thereby obtaining 3.167 g of needle-like crystal (yield=94%). The purity of the obtained compound was evaluated by ICP Mass with respect to 77 element. FIG. 1 shows the results. Since the results revealed a significantly small content of impurity element of 77 element, it can be understood that a perovskite material having a high element purity was obtained.

The structure of the obtained complex was determined by a single-crystal X-ray structure analysis. FIG. 2 shows the obtained X-ray crystal structure.

$CH_3NH_3PbI_3$.DMF Complex ($MAPbI_3$.DMF Complex)

Measurement of the colorless needle-like crystal obtained by the above method was performed using a Bruker Single Crystal CCD X-ray Diffractometer (SMART APEX II ULTRA, X-ray source: Mo Kα radiation (λ=0.71073 Å)) by cooling the crystal to 100 K. 6755 reflections in total were observed in a range where the 2θ angle=51.00. Of these, 2577 reflections were independent, and the $R_{int}$ value was 0.0248. The structure was analyzed by a direct method. The following crystal data were obtained. $C_4H_{12}I_3N_2OPb$; FW=693.05, crystal size 0.19×0.06×0.03 mm³, Monoclinic, P21/c, a=4.5457(13)Å, b=25.309(7)Å, c=12.072(4)Å, β=96.475(4)°, V=1380.0(7)Å³, Z=4, $D_c$=3.336 g cm-³. The refinement converged to $R_1$=0.0293, $wR_2$=0.0747 (I>2σ(I)), GOF=1.348.

Figure 3:
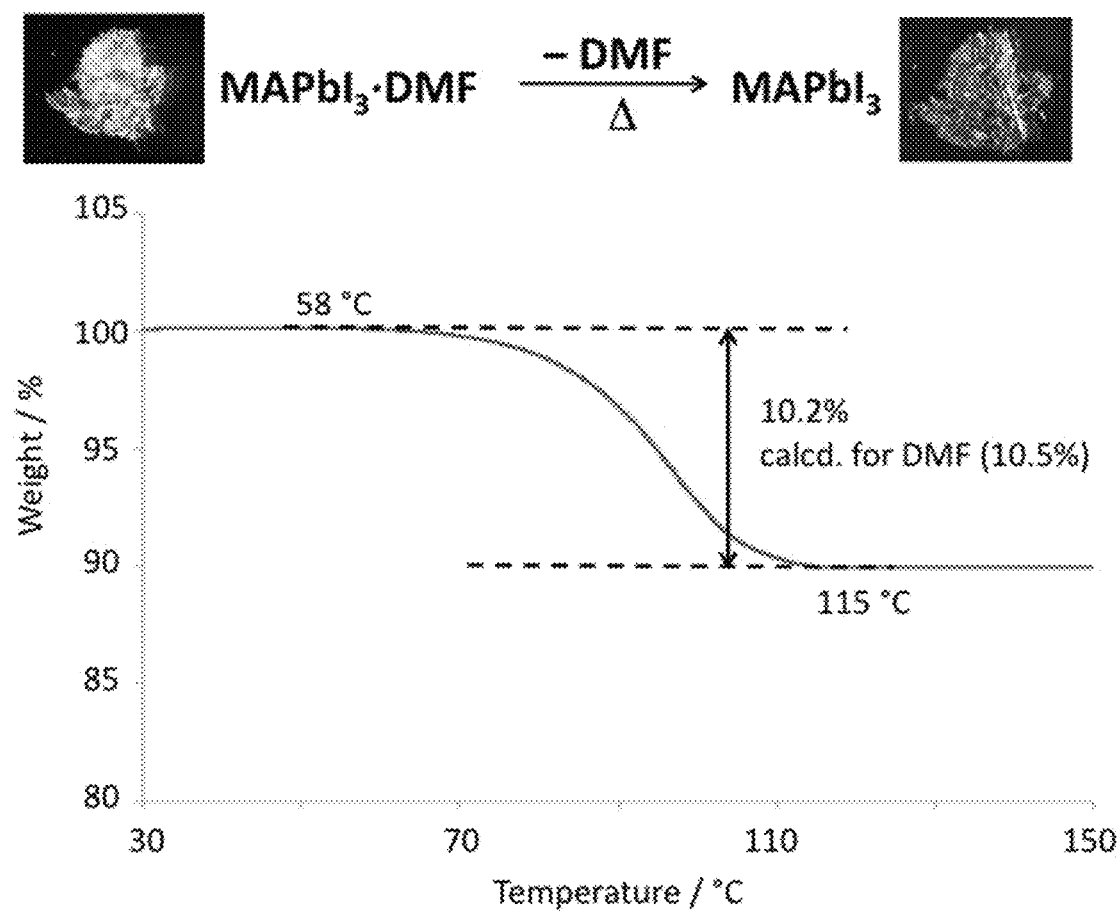
FIG. 3 shows the results of TGA measurement of the $MAPbI_3 \cdot DMF$ complex obtained in Example 1.

Next, FIG. 3 shows the results of thermal analysis (TGA measurement) with respect to the obtained $CH_3NH_3PbI_3$.DMF complex at a temperature-increase rate of 5° C./minute. The results reveal that the DMF solvent began to be removed at around 70° C., and that DMF was removed substantially completely at 106° C. The black crystal obtained by heating was a perovskite material in which DMF was removed ($CH_3NH_3PbI_3$).

Example 2: $FAPbI_3$.2DMF Complex $PbI_2$ (922 mg, 2.0 mmol) and formamidinium iodide (FAI; $CH(NH_2)_2I$; 344 mg, 2.0 mmol) were added to dimethylformamide (DMF; 2.0 mL, corresponding to $FAPbI_3$ 1.0 M) and the mixture was stirred for 10 minutes at 70° C., and allowed to cool to room temperature, thereby obtaining a solution. 200 μL of the solution was placed in a screw tube, and 100 μL of DMF was gently placed thereon as a cushion layer. Then 1 mL of toluene was added as a poor solvent. A lid was placed on the container, followed by being kept still at room temperature for 2 days, thereby obtaining 105 mg of a pale yellow, needle-like crystal (yield=83%). The purity of the obtained compound was evaluated by ICP Mass with respect to 77 element. FIG. 4 shows the results. Since the results revealed a significantly small content of impurity element of 77 element, it can be understood that a perovskite material having a high element purity was obtained.

Figure 5:
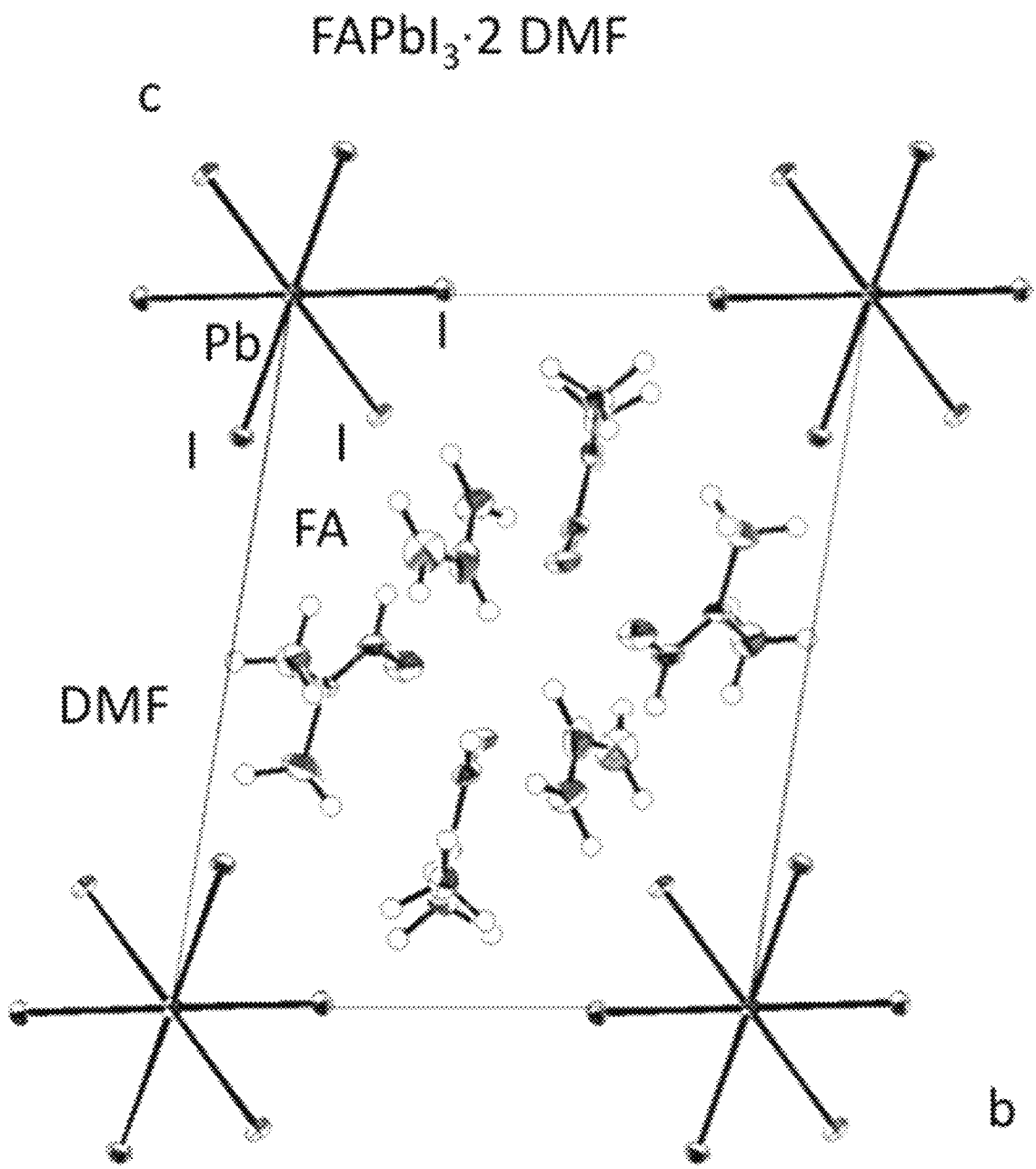
FIG. 5 shows X-ray crystal structure of the $FAPbI_3 \cdot 2DMF$ complex obtained in Example 2.

The structure of the obtained complex was determined by a single-crystal X-ray structure analysis. FIG. 5 shows the obtained X-ray crystal structure.

$CH(NH_2)_2PbI_3$.2DMF Complex ($FAPbI_3$.2DMF Complex)

Measurement of the colorless, needle-like crystal obtained by the above method was performed using Bruker Single Crystal CCD X-ray Diffractometer (SMART APEX II ULTRA, X-ray source: Mo Kα radiation (λ=0.71073 Å)) by cooling the crystal to 100 K. 7146 reflections in total were observed in a range where the 2θ angle=51.0°. Of these, 3465 reflections were independent, and the $R_{int}$ value was 0.0225. The structure was analyzed by a direct method. The crystal data were as follows. $C_7H_{19}I_3N_4O_2Pb$; FW=779.15, crystal size 0.46×0.12×0.10 mm³, Triclinic, P-1, a=7.8936 (9)Å, b=10.5075(12)Å, c=12.6927(15)Å, α=75.8214(12)°, β=74.9250(12)°, γ=68.9286(12)°, V=935.06(19)Å³, Z=2, $D_c$=2.767 g cm-³. The refinement converged to $R_1$=0.0199, $wR_2$=0.0503 (I>2σ(I)), GOF=1.056.

Figure 6:
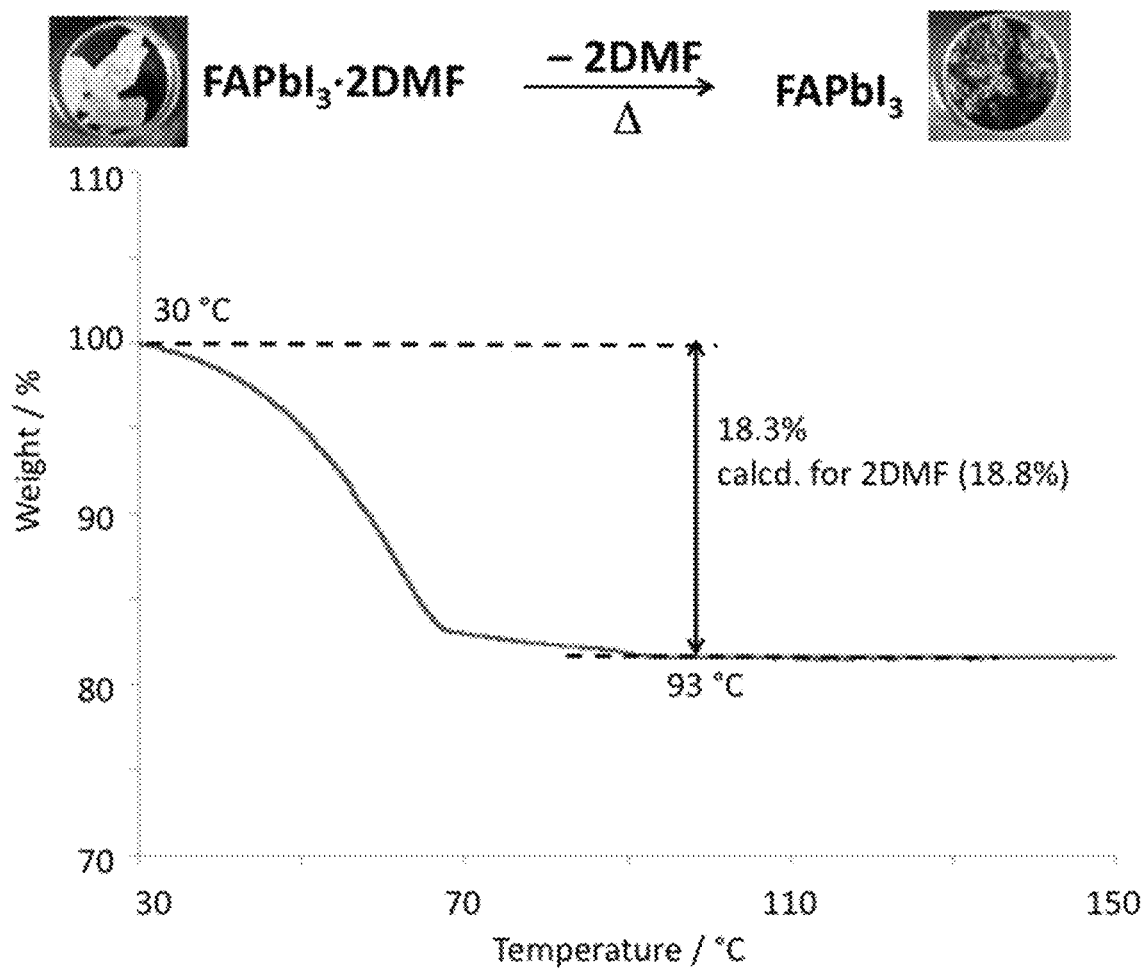
FIG. 6 shows the results of TGA measurement of the $FAPbI_3 \cdot 2DMF$ complex obtained in Example 2.

Next, FIG. 6 shows the results of thermal analysis (TGA measurement) with respect to the obtained $CH(NH_2)_2PbI_3$.2DMF complex at a temperature-increase rate of 1° C./minute. The results reveal that the DMF solvent began to be removed at around 30° C., and that DMF was removed substantially completely at 93° C. The black crystal obtained by heating was a perovskite material in which DMF was removed ($CH(NH_2)_2PbI_3$).

Comparative Example 1: $MA_2Pb_3I_8$.2DMSO Complex $PbI_2$ (507 mg, 1.1 mmol) and methylammonium iodide (MAI; $CH_3NH_3I$; 175 mg, 1.1 mmol) were dissolved in dimethylsulfoxide (DMSO; 1.0 mL, corresponding to $MA_2Pb_3I_8$ 1.1 M). The solution (about 100 μL) was placed on a slide glass on a hot plate, and the temperature of the hot plate was set to 73° C. As a result, a colorless, needle-like crystal was grown. The generated crystal was washed with acetonitrile, and separated.

Figure 7:
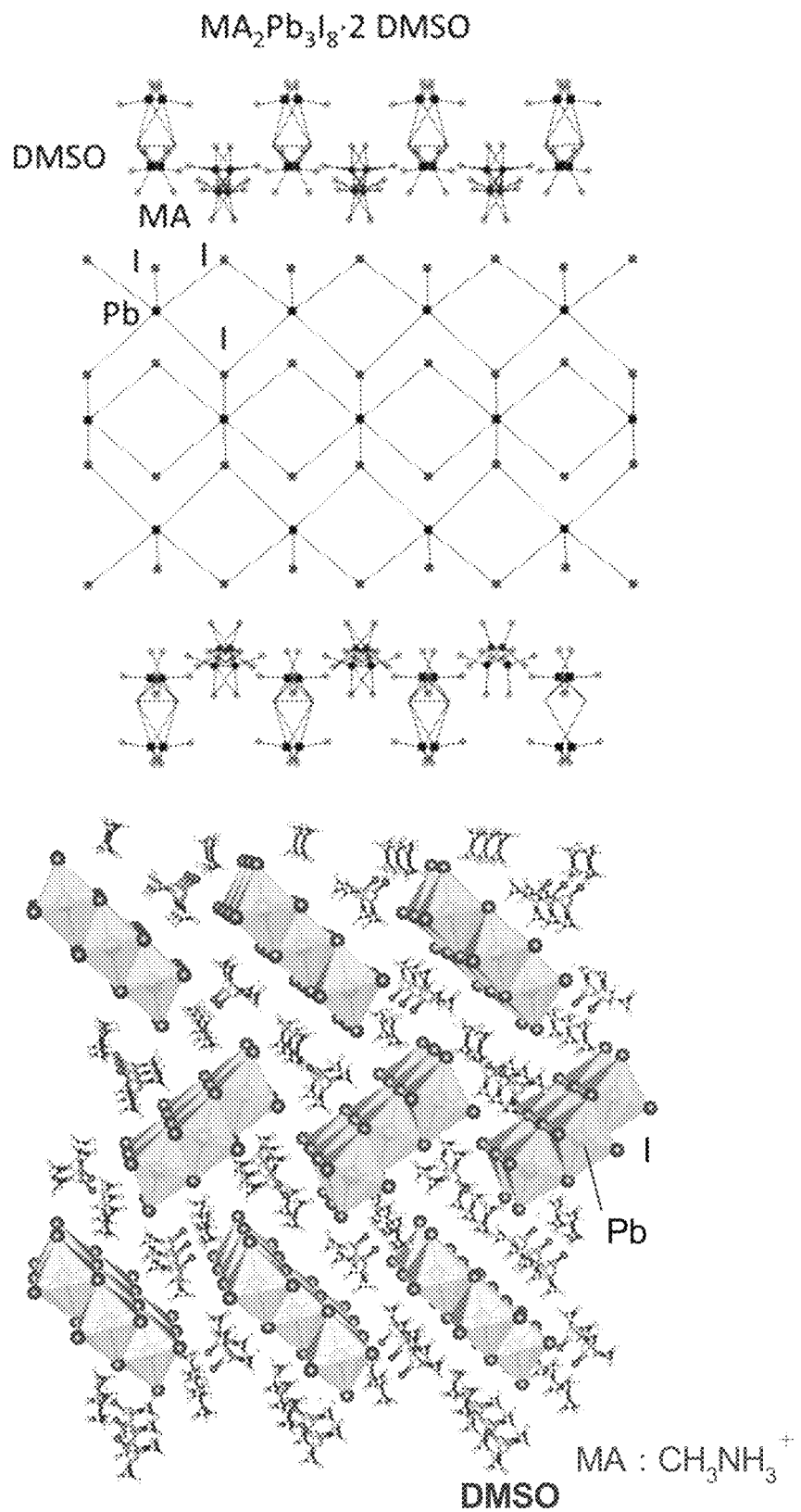
FIG. 7 shows X-ray crystal structure of the $MA_2Pb_3I_8 \cdot 2DMSO$ complex obtained in Comparative Example 1.

The structure of the obtained complex was determined by a single-crystal X-ray structure analysis. FIG. 7 shows the obtained X-ray crystal structure. The face index measurement of this single crystal revealed that the one-dimensional network structure of Pb—I aligned in the vertical direction in the paper plane corresponds to the long-axis direction of the crystal.

(CH$_3$NH$_3$)$_2$Pb$_3$I$_8$·2DMSO Complex (MA$_2$Pb$_3$I$_8$·2DMSO Complex)

Measurement of the colorless, needle-like crystal obtained by the above method was performed using a Bruker Single Crystal CCD X-ray Diffractometer (SMART APEX II ULTRA, X-ray source: Mo Kα radiation (λ=0.71073 Å)) by cooling the crystal to 100 K. 8343 reflections in total were observed in a range where the 2θ angle=51.00. Of these, 3525 reflections were independent, and the R$_{int}$ value was 0.0324. The structure was analyzed by a direct method. The crystal data were as follows. C$_6$H$_{24}$I$_8$N$_2$O$_2$Pb$_3$S$_2$; FW=1857.16, crystal size 0.19×0.08×0.02 mm$^3$, Orthorhombic, Cmc21, a=4.5887(9)Å, b=27.262(5)Å, c=26.789(5)Å, V=3351.2(11)Å$^3$, Z=4, D$_c$=3.681 g cm$^{-3}$. The refinement converged to R$_1$=0.0322, wR$_2$=0.0763 (I>2σ(I)), GOF=1.178.

Figure 8:
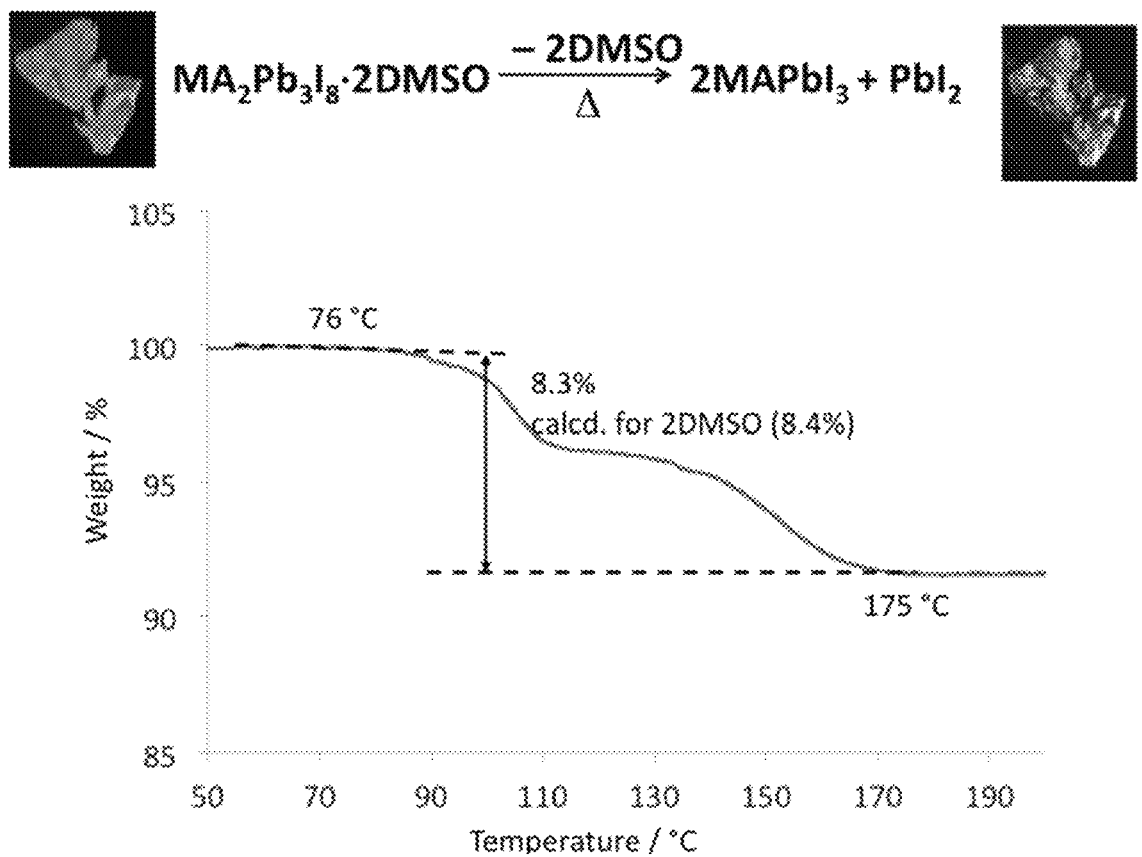
FIG. 8 shows the results of TGA measurement of the $MA_2Pb_3I_8 \cdot 2DMSO$ complex obtained in Comparative Example 1.

Next, FIG. 8 shows the results of thermal analysis (TGA measurement) with respect to the obtained (CH$_3$NH$_3$)$_2$Pb$_3$I$_8$·2DMSO complex at a temperature-increase rate of 5° C./minute. The results reveal that the DMSO solvent began to be removed at around 76° C., that the DMSO solvent was removed stepwise in two steps, and that the DMSO was finally removed substantially completely at 175° C. The black crystal obtained by heating was a perovskite material in which DMSO was removed (CH$_3$NH$_3$PbI$_3$).

Example 3: MA$_2$Pb$_3$I$_8$·2DMF Complex

Dimethylsulfoxide (DMSO; 71 µL) was added to PbI$_2$ (461 mg, 1.0 mmol) and methylammonium iodide (MAI; CH$_3$NH$_3$I; 159 mg, 1.0 mmol), and the mixture was dissolved in dimethylformamide (DMF; 600 µL). The solution (about 100 µL) was placed on a slide glass on a hot plate, and the temperature of the hot plate was set to 55° C. As a result, a colorless, needle-like crystal was grown. The generated crystal was washed with acetonitrile, and separated. In this Example, the ratio between the addition amounts of DMSO and DMF is such that DMSO:DMF=1:7.7 (molar ratio), 1:8.5 (volume ratio).

Figure 9:
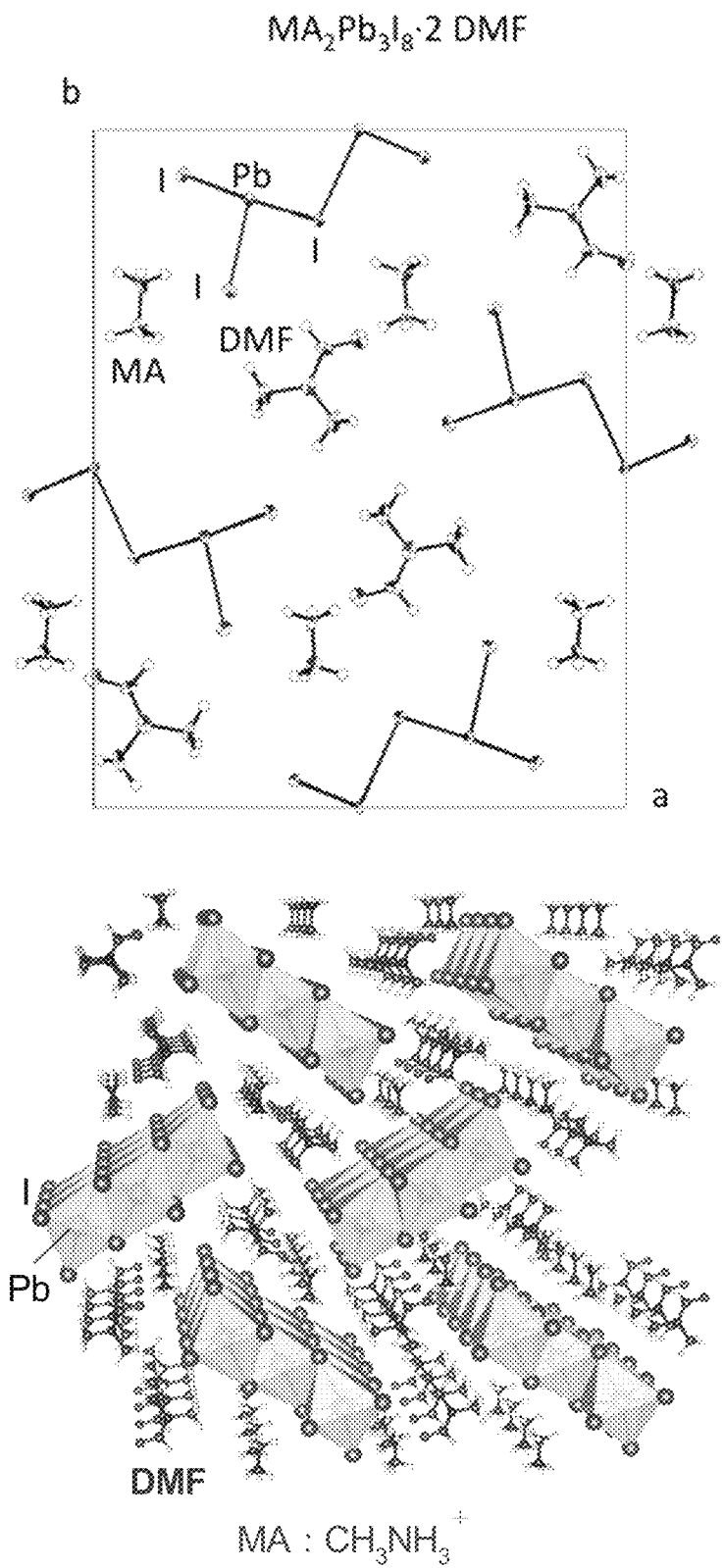
FIG. 9 shows X-ray crystal structure of the $MA_2Pb_3I_8 \cdot 2DMF$ complex obtained in Example 3.

The structure of the obtained complex was determined by a single-crystal X-ray structure analysis. FIG. 9 shows the obtained X-ray crystal structure. The face index measurement of this single crystal revealed that the one-dimensional network structure of Pb—I aligned in the vertical direction in the paper plane corresponds to the long-axis direction of the crystal.

(CH$_3$NH$_3$)$_2$Pb$_3$I$_8$·2DMF Complex (MA$_2$Pb$_3$I$_8$·2DMF Complex)

Measurement of the colorless, needle-like crystal obtained by the above method was performed using a Bruker Single Crystal CCD X-ray Diffractometer (SMART APEX II ULTRA, X-ray source: Mo Kα radiation (λ=0.71073 Å)) by cooling the crystal to 100 K. 7002 reflections in total were observed in a range where the 2θ angle=51.0°. Of these, 1743 reflections were independent, and the R$_{int}$ value was 0.0642. The structure was analyzed by a direct method. The crystal data were as follows. C$_8$H$_{26}$I$_8$N$_4$O$_2$Pb$_3$; FW=1847.10, crystal size 0.38×0.06×0.04 mm$^3$, Orthorhombic, Pnnm, a=17.106(9)Å, b=21.767(11)Å, c=4.502(2) Å, V=1676.4(15)Å$^3$, Z=2, D$_c$=3.659 g cm$^{-3}$. The refinement converged to R$_1$=0.0471, wR$_2$=0.1186 (I>2σ(I)), GOF=0.954.

Figure 10:
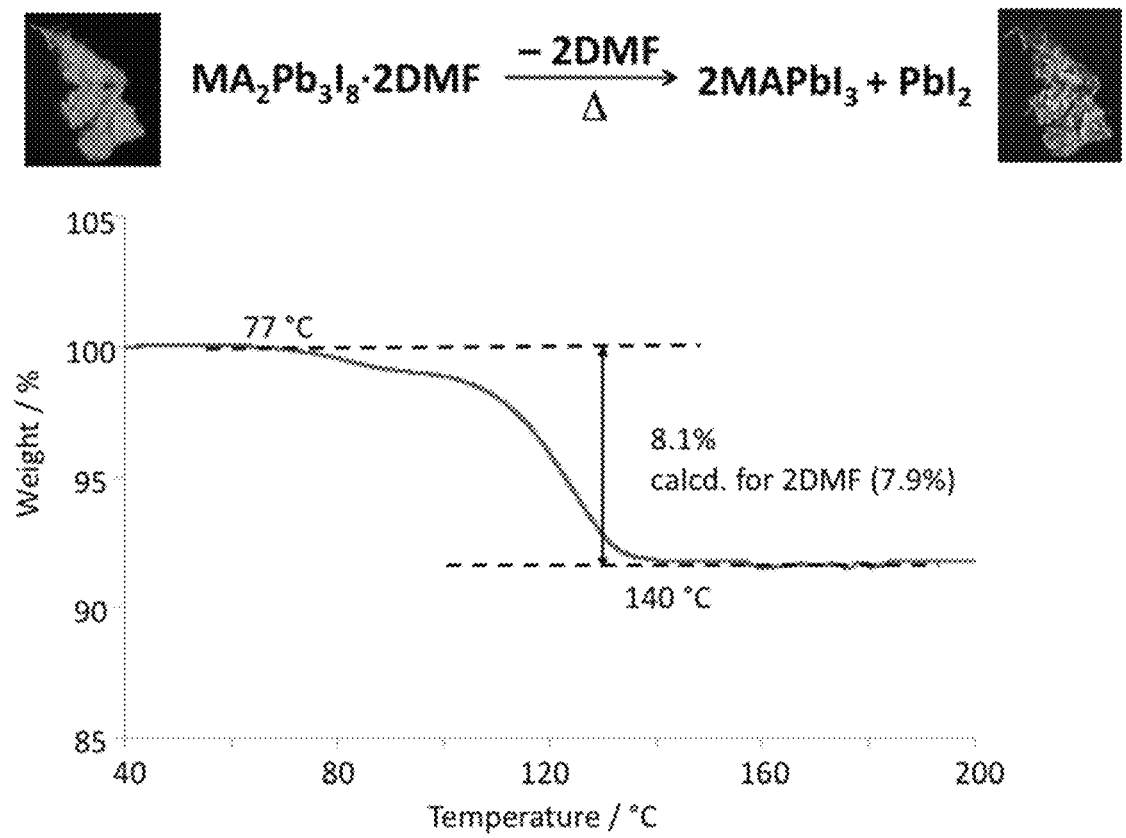
FIG. 10 shows the results of TGA measurement of the $MA_2Pb_3I_8 \cdot 2DMF$ complex obtained in Example 3.

Next, FIG. 10 shows the results of thermal analysis (TGA measurement) with respect to the obtained (CH$_3$NH$_3$)$_2$Pb$_3$I$_8$·2DMF complex at a temperature increase rate of 5° C./minute. The results reveal that the DMF solvent began to be removed at around 77° C., and that DMF was removed substantially completely at 140° C. The black crystal obtained by heating was a perovskite material in which DMF was removed (CH$_3$NH$_3$PbI$_3$).

Example 4

The same method as that of Example 3 was performed, except that the molar ratio of DMSO to DMF was set to the ratio shown in Table 1 to obtain a 1.0 M solution. Each entry yielded a colorless, needle-like crystal. Measurement of the obtained colorless, needle-like crystals was performed using a Bruker Single Crystal CCD X-ray Diffractometer (SMART APEX II ULTRA, X-ray source: Mo Kα radiation (λ=0.71073 Å)) with the crystal at 100 K. Further, a single-crystal X-ray structure analysis was performed.

The obtained complexes varied depending on the mixing ratio of the solvent used, as shown in the results of Table 1. In Table 1, entry 6 corresponds to Example 3 described above.

TABLE 1

| entry | DMSO:DMF (Molar Ratio) | Space Group | Complex |
|---|---|---|---|
| 1 | 1:0 | Orthorhombic, Cmc21[a] | MA$_2$Pb$_3$I$_8$•2DMSO |
| 2 | 7.7:1 | Orthorhombic, Cmc21[a] | MA$_2$Pb$_3$I$_8$•2DMSO |
| 3 | 3:1 | Orthorhombic, Cmc21[a] | MA$_2$Pb$_3$I$_8$•2DMSO |
| 4 | 1:1 | Orthorhombic, Cmc21[a] | MA$_2$Pb$_3$I$_8$•2DMSO |
| 5 | 1:3 | Orthorhombic, Cmc21[a] | MA$_2$Pb$_3$I$_8$•2DMSO |
| 6 | 1:7.7 | Orthorhombic, Pnnm[b] | MA$_2$Pb$_3$I$_8$•2DMF |
| 7 | 0:1 | Orthorhombic, Pnnm[b] | MA$_2$Pb$_3$I$_8$•2DMF |

[a]Cell parameters: a = 4.595-4.623 Å, b = 27.26-27.40 Å, c = 26.26-27.40 Å.
[b]Cell parameters: a = 17.08-17.11 Å, b = 21.77-21.89 Å, c = 4.50-4.55 Å.

Examples 5 to 7 and Reference Examples 1 and 2: Perovskite Material

Example 5: MAPbI$_3$

Figure 11:
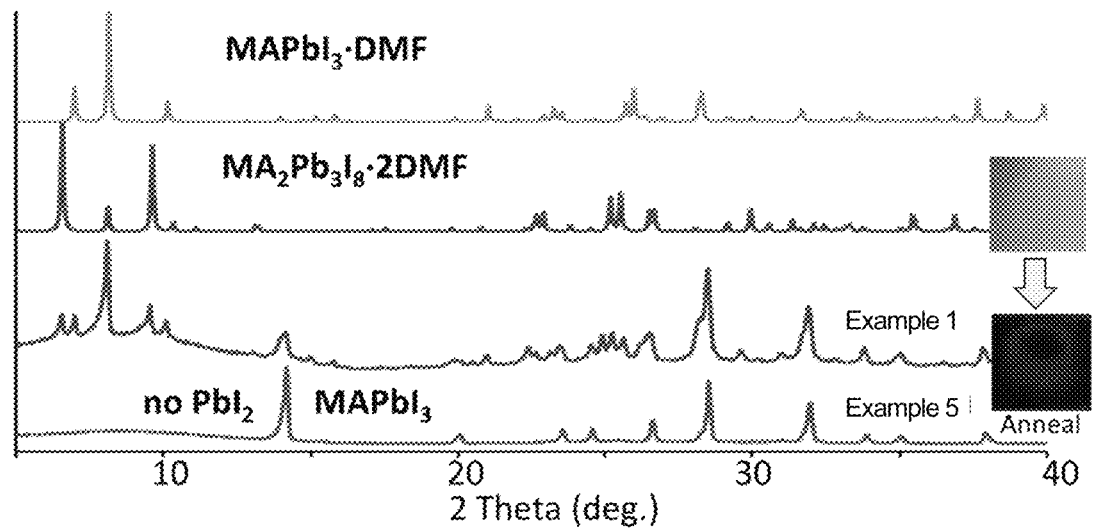
FIG. 11 shows an X-ray diffraction spectrum of an unannealed transparent film and an annealed black film.

A DMF solution of the crystal obtained in Example 1 (the solution before the filtration and drying) or a 1.55 M DMF solution in which PbI$_2$ and MAI at a molar ratio of 1:1 are dissolved was applied onto a mesoporous TiO$_2$ layer by spin coating in an amount of 200 µL (per 2.5 cm square electrode), and, 3 seconds before completion, 450 µL of toluene was added in 2 seconds. The obtained transparent film was immediately heated for 30 minutes at 100° C. or less, and then heated (annealed) for 30 minutes at 100° C. As a result, it was changed to a peak corresponding to perovskite MAPbI$_3$ free from PbI$_2$ (FIG. 11). The first and second spectra shown in FIG. 11 are XRD spectra of MAPbI$_3$.DMF and MA$_2$Pb$_2$I$_8$.2DMF, respectively, predicted from the single-crystal X-ray structure analysis data obtained by the measurements described in Examples 1 and 3. The third spectrum in FIG. 11 corresponds to the X-ray diffraction spectrum of the unannealed transparent film obtained in Example 5, and the fourth spectrum corresponds to the X-ray diffraction spectrum of the black film obtained after the transparent film was annealed. A comparison between the first and second spectra, and the third spectrum revealed that the obtained transparent film contained both MAPbI$_3$.DMF and MA$_2$Pb$_2$I$_8$.2DMF. Further, in the fourth spectrum after the annealing, only a peak corresponding to perovskite (MAPbI$_3$) was observed, and peaks of the precursors $MAPbI_3 \cdot DMF$ and $MA_2Pb_2I_8 \cdot 2DMF$, and the characteristic peak of $PbI_2$ that appears near 13°, were not observed. $MAPbI_3$ as a highly pure perovskite material was thus obtained.

Figure 12:
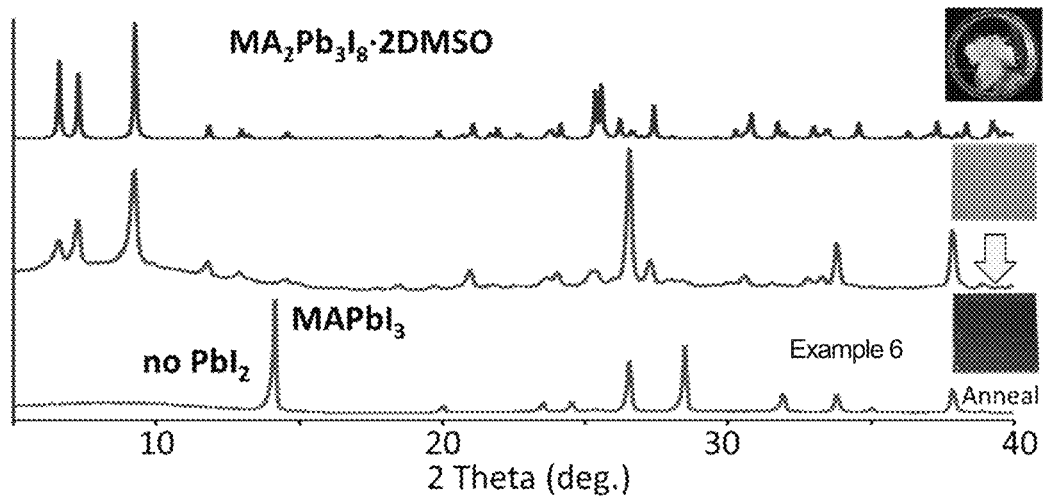
FIG. 12 shows X-ray diffraction spectra of a film (before and after annealing) obtained in Example 6.

Example 6: $MAPbI_3$ $MA_2Pb_3I_8 \cdot 2DMSO$ was formed in the same manner as in Example 1, except that DMSO was used as a solvent instead of DMF. The film was heated (annealed) in the same manner as in Example 5, thereby forming $MAPbI_3$ free from $PbI_2$. FIG. 12 shows the X-ray diffraction spectrum. The first spectrum shown in FIG. 12 is a spectrum of $MA_2Pb_3I_8 \cdot 2DMSO$ complex predicted from the single-crystal X-ray analysis data. The second spectrum is the actual measured spectrum before the annealing, and the third spectrum is the actual measured spectrum after the annealing. The results revealed that the peak of $MA_2Pb_3I_8 \cdot 2DMSO$ complex, and the characteristic peak of $PbI_2$ that appears near 13° were not observed in the spectrum of the film after the annealing, and that $MAPbI_3$ having high purity was obtained.

Reference Example 1: $MAPbI_3 + PbI_2$

The same treatment as that in Example 5 was performed, except that toluene was not added after $PbI_2$ and MAI were dissolved in DMF; as a result, perovskite $MAPbI_3$ was obtained. However, as a result of the confirmation using X-ray diffraction, it was confirmed that $CH_3NH_3PbI_3 \cdot DMF$ complex as an intermediate also remained.

Example 7: $MAPbI_3$

Figure 13:
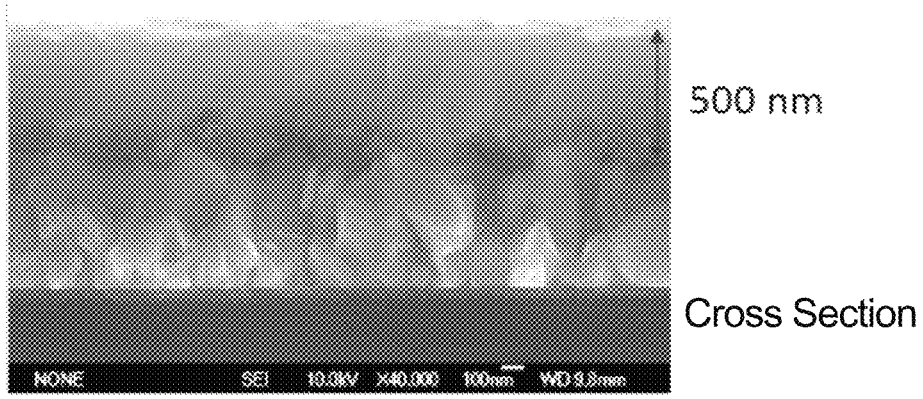
FIG. 13 shows a scanning electron microscope (SEM) image of the cross-section of a film (after annealing) obtained in Example 7.
Figure 13:
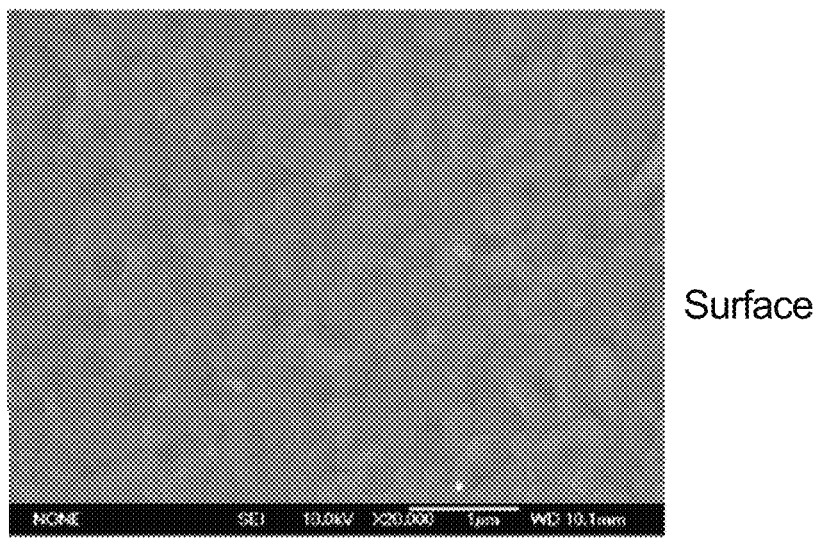
Figure 14:
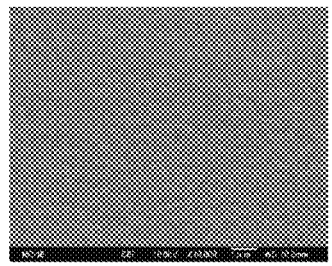
FIG. 14 shows SEM images obtained by surface observation of perovskite material using a scanning electron microscope (SEM) with respect to a perovskite film obtained in Example 7 and a transparent film obtained in Reference Example 2.
Figure 14:
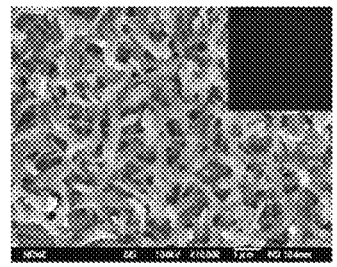

The same method as that of Example 1 was performed, except that the volume ratio of DMSO to DMF was set to 1:3 to obtain a 1.5 M solution, thereby yielding a colorless, needle-like crystal. The obtained crystal was applied onto a mesoporous $TiO_2$ layer (electron transport layer) by spin coating in an amount of 200 μL (per 2.5 cm square electrode); and 0.5 mL toluene was added thereto dropwise, thereby obtaining a transparent film. The surface of the obtained film was observed using a scanning electron microscope (SEM). The grain size of the major component of the resulting film was about 10 to 350 nm. The obtained film was annealed for 5 minutes at 40 to 80° C., and then annealed for 30 minutes at 100° C., thereby obtaining a perovskite film. The surface of the obtained perovskite film was observed using a scanning electron microscope (SEM). FIGS. 13 and 14 show the results. As is clearly shown in FIGS. 13 and 14, a flat crystal with a large grain size was obtained. It is suggested that when this crystal is used as a perovskite layer of a perovskite solar cell, superior solar cell characteristics can be obtained. The grain size of the major component was about 200 to 400 nm.

Reference Example 2

Figure 15:
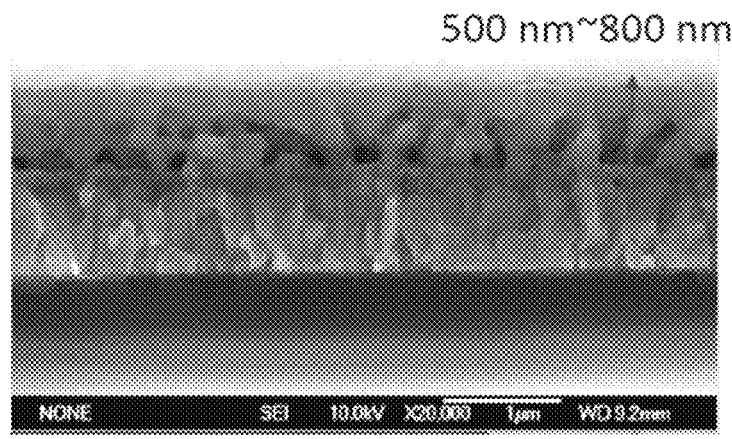
FIG. 15 shows a scanning electron microscope (SEM) image of the cross-section of a film (after annealing) obtained in Reference Example 2.

The same treatment as that in Example 7 was performed, except that toluene was not added after the spin coating, thereby obtaining a transparent film. The surface of the obtained film was observed using a scanning electron microscope (SEM) (the right-side drawing of FIG. 14). The grain size of the major component of the resulting film was about 10 to 1000 nm. The orientation of the film was poor, and the flatness of the film was also poor; namely, the height difference was about 50 to 500 nm. The obtained film was annealed in the same manner as in Example 7; as a result, the film was converted to a brown film, and perovskite $MAPbI_3$ was partially obtained. However, the XRD measurement results revealed that the precursor complex $MA_2Pb_3I_8 \cdot 2DMF$, $MAPbI_3 \cdot DMF$ (when a DMF solution was used) or $MA_2Pb_3I_8 \cdot 2DMSO$ (when a solution containing DMFSO was used) remained. The surface of the obtained film was observed using a scanning electron microscope (SEM); the results confirmed formation of a thin film that is nondense, having a porous structure with many gaps, and retaining the shape of the precursor (FIG. 15). More specifically, as a result of the observation of the brown film after the annealing using a scanning electron microscope (SEM), it was found that a thin film that is nondense, having a porous structure with many gaps, and retaining the shape of the precursor, was formed. The grain size of the major component was about 50 to 150 nm.

Example 8 and Reference Example 3: Perovskite Layer Example 8

A FTO substrate that was UV ozone-treated immediately before was placed in a glove box. A solution was prepared by adding to a mixture of $PbI_2$ and MAI at 1:1 (molar ratio) a mixed solvent of DMF and DMSO (Vol, 3:1) while adjusting the concentration to 1.5 M. The obtained solution was applied onto a FTO substrate in an amount of about 200 μL (per 2.5-cm square electrode), followed by spin coating, during which 0.5 mL toluene was added thereto dropwise, thereby obtaining a film constituted of a complex.

Figure 16:
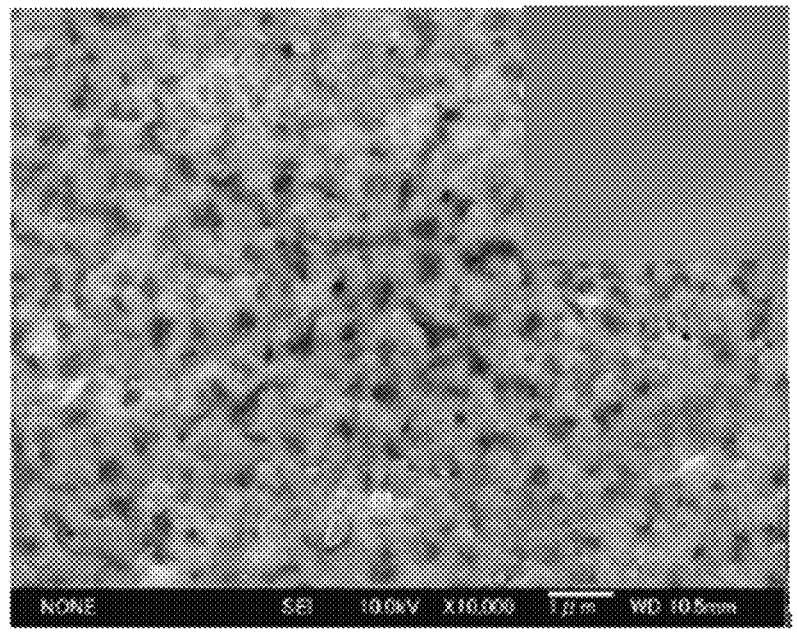
FIG. 16 shows a scanning electron microscope (SEM) image of a flat plane of a film of Example 8.
Figure 17:
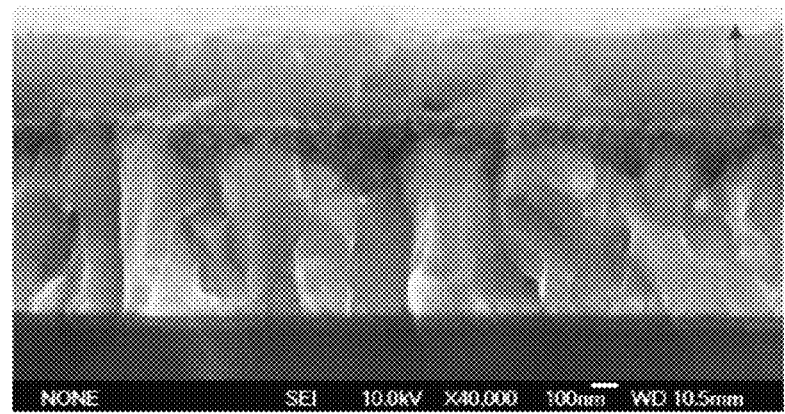
FIG. 17 shows a scanning electron microscope (SEM) image of a cross-section of a film of Example 8.

FIG. 16 shows a scanning electron microscope image of the surface of the obtained film, and FIG. 17 shows a scanning electron microscope image of the cross-section of the obtained film. As shown in the figure, a film having a thickness in a range of 412 to 456 nm is formed from a complex constituted of a needle-like microcrystal having a width of about 50 nm and a length of about 500 nm. Regarding the flatness, the height difference in a flat surface of 500 nm×500 nm was 8 to 40 nm.

Figure 18:
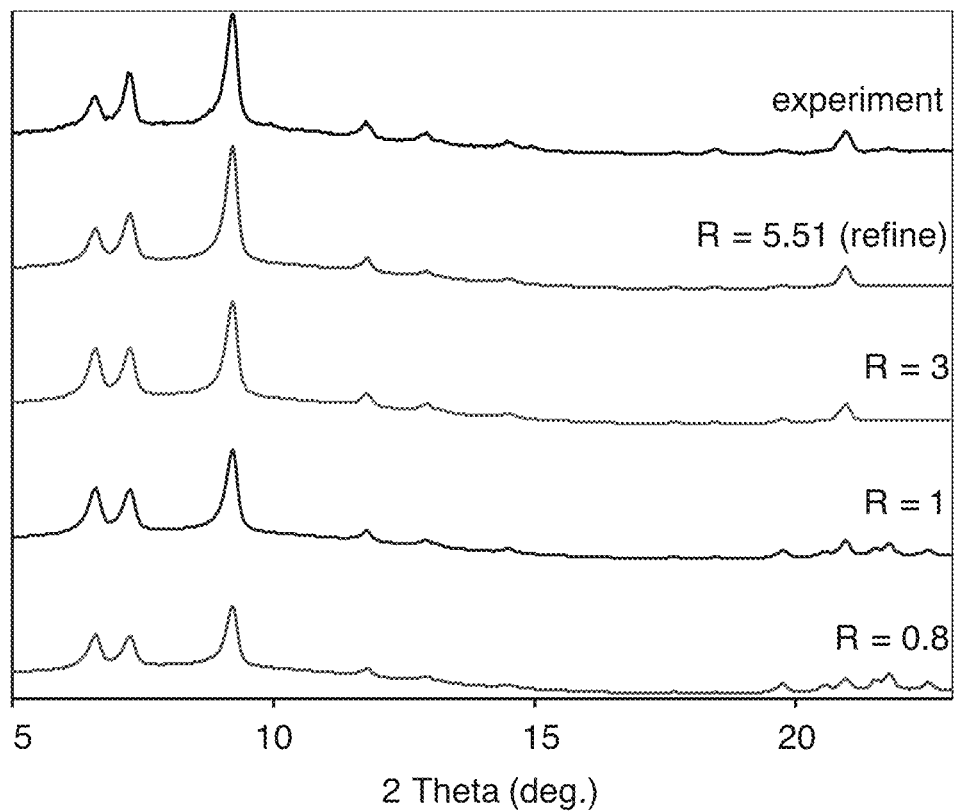
FIG. 18 shows the results of evaluation regarding orientation of a complex in a film of Example 8 using a simulation based on Rietveld analysis (RIETAN-FP).

Next, the orientation of the crystal corresponding to [2-11] plane was evaluated by a simulation using Rietveld analysis (RIETAN-FP). FIG. 18 shows the results. For reference, R<1 means that the preferred orientation vector is perpendicularly oriented with respect to the substrate, R=1 means absence of selective orientation property, and R>1 means that the preferred orientation vector is oriented parallel with respect to the substrate. The results revealed that the case where orientation coefficient R=5.51(>1) most reflected the actual measured data of the film of Example 8. More specifically, it can be understood that the complex of the present invention has an orientation in which the long-axis direction (Pb—I network direction) of the needle-like microcrystal is aligned parallel with respect to the substrate surface.

Reference Example 3

The same treatment as that in Example 8 was performed, except that toluene was not added after the spin coating, thereby obtaining a film constituted of a complex.

Figure 19:
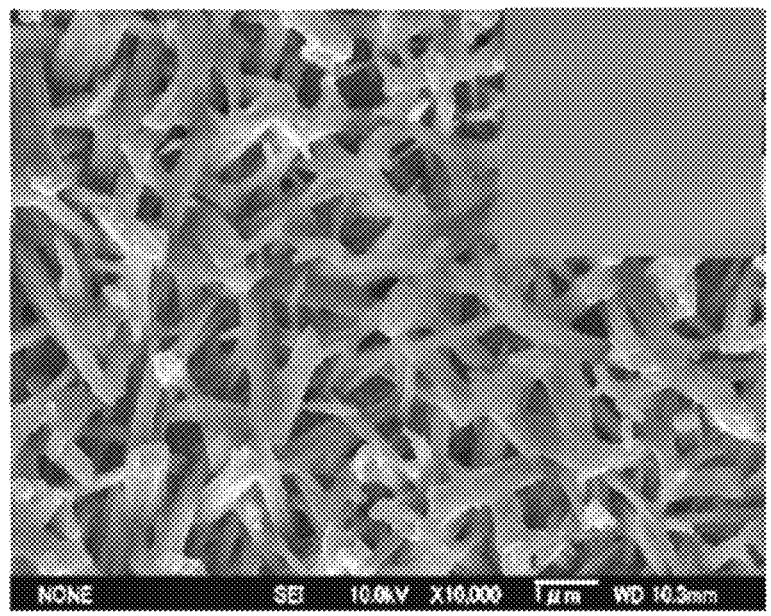
FIG. 19 shows a scanning electron microscope (SEM) image of a flat plane of a film of Reference Example 3.

FIG. 19 shows a scanning electron microscope image of the surface of the obtained film. The results revealed that a film was formed from a complex constituted of a needle-like crystal having a width of about 500 nm or more, and a length of about 1000 nm or more; however, this film was not flat.

Examples 9 and 10; Perovskite Solar Cell

Example 9: Perovskite Solar Cell

The patterned transparent conductive glass substrate (FTO, 25 mm×25 mm, Asahi Glass Co., Ltd., Japan) was subjected to ultrasonic cleaning using 1 mass % neutral detergent aqueous solution, acetone, 2-propanol, and distilled water in this order, individually for 10 minutes. Finally, UV ozone cleaning was performed for 15 minutes.

0.05 M of titanium di(isopropoxide)bis(acetylacetonate) (75 mass % 2-propanol solution, Tokyo Chemical Industry Co., Ltd., Japan) was sprayed (carrier gas: $N_2$, 0.5 MPa) onto the FTO substrate (transparent electrode) on a hot plate at 450° C., thereby forming a compact $TiO_2$ layer (about 150 nm). Further, the obtained substrate was immersed in 100 mL of $TiCl_4$ (440 µL, special grade, Wako Pure Chemical Industries Ltd., Japan) aqueous solution at 70° C. for 30 minutes. Thereafter, the substrate was baked at 500° C. for 20 minutes, thereby forming a (positive hole) blocking layer.

On the obtained compact $TiO_2$ layer ((positive hole) blocking layer), $TiO_2$ paste (PST-18NR, JGC Catalysts and Chemicals Ltd.) dissolved in ethanol (paste:ethanol=1:5 (mass ratio)) was applied by spin coating in an amount of about 190 µL (per 2.5 cm square electrode), thereby forming a mesoporous $TiO_2$ layer (electron transport layer) having a thickness of about 200 nm.

The substrate that was provided with the above layers including the mesoporous $TiO_2$ layer (electron transport layer), and was also UV ozone-treated immediately before, was placed in a glove box. 1.5 M perovskite precursor DMSO solution obtained as described later was applied to the substrate by spin coating in an amount of about 250 µL (per 2.5 cm square electrode) onto the mesoporous $TiO_2$ layer (electron transport layer). Next, 0.5 mL of toluene was further added to the substrate dropwise, and the obtained film was annealed for 5 minutes at 50° C.; and further annealed for 30 minutes at 100° C., thereby obtaining a flat and dense perovskite layer having a thickness of about 350 nm.

A positive hole transport material (PTAA; poly[bis(4-phenyl) (2,4,6-trimethylphenyl)amine], 10 mg) and 4-t-butylpyridine (TBP; 4 µL, 0.027 M, Aldrich), and lithium-bis(trifluoromethylsulfonyl)imide (LITFSI; 1.3 mg, 0.005 M, Wako Pure Chemical Industries Co., Ltd.) were dissolved in 1 mL of toluene. After 30-minute stirring, the solution was filtered by a membrane filter, and the filtrate was applied to the perovskite layer by spin coating. The resulting substrate was annealed for 30 minutes at 70° C. to form a positive hole transporting layer (about 50 nm); thereafter, a gold electrode of 80 nm was attached onto the positive hole transporting layer by vacuum deposition, thereby obtaining a perovskite solar cell.

The perovskite precursor DMSO solution was obtained as follows.

Precursor Solution (1): Unpurified $PbI_2$ and MAI (Purified Product)

Unpurified $PbI_2$ (692 mg, 1.5 mmol) and MAI (purified product of TCI; 238 mg, 1.5 mmol) were added to 1 mL DMSO, and dissolved by stirring for 20 minutes. The saturated concentration (DMSO solution) is 1.7 M at 25° C., and 1.2 M at 45° C.

Precursor Solution (2): $MAPbI_3$.DMF Complex

The $MAPbI_3$.DMF complex (1040 mg, 1.5 mmol) obtained in Example 1 was added to 884 µL of DMSO, and dissolved by stirring for 2 minutes. The saturated concentration (DMSO solution) is 2.0 M at 25° C., and 3.3 M at 45° C.

Precursor Solution (3): $MAPbI_3$.DMF Complex (after Thermal Drying at 60° C., 30 mmHg)

The $MAPbI_3$.DMF complex (1040 mg, 1.5 mmol) obtained in Example 1 was weighed, and dried under reduced pressure for 4 hours at 60° C., 30 mmHg. Thereafter, the obtained complex was placed in 1 mL DMSO, and dissolved by stirring for 2 minutes.

As described above, in contrast to the previously known one-solution method that requires 20-minute stirring to produce a DMSO solution, the production using the complex of the present invention required only a 2-minute stirring, thereby reducing the stirring time.

Figure 20:
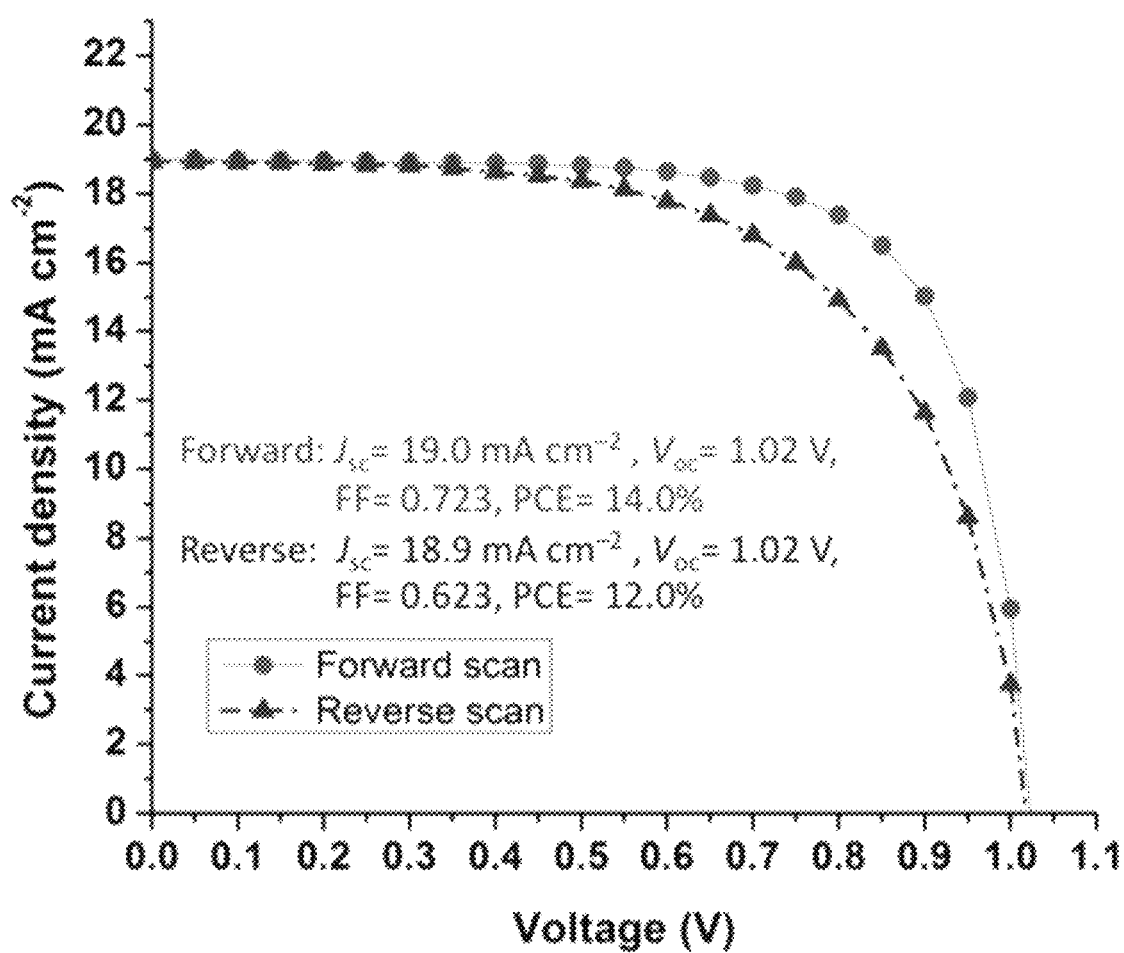
FIG. 20 shows the results of solar cell characteristics of a perovskite solar cell obtained by using precursor solution (1) in Example 9.
Figure 21:
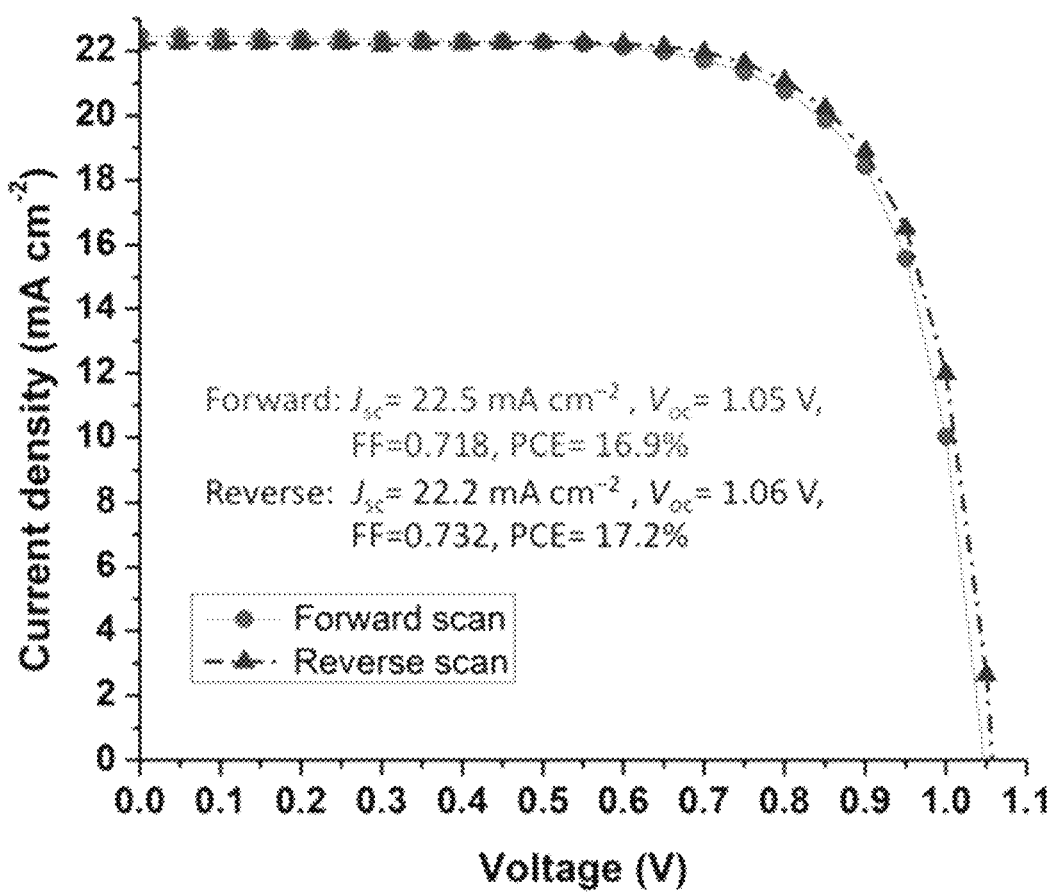
FIG. 21 shows the results of solar cell characteristics of a perovskite solar cell obtained by using precursor solution (2) in Example 9.
Figure 22:
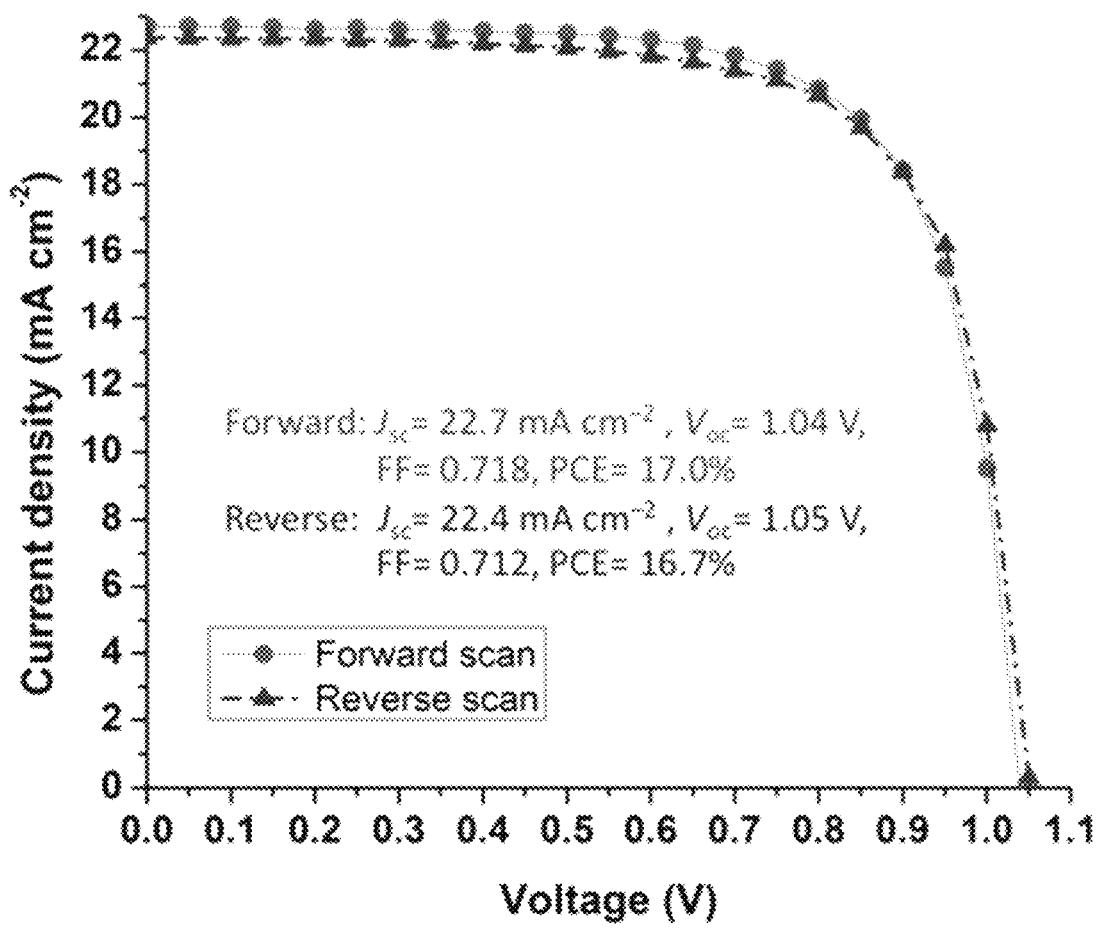
FIG. 22 shows the results of solar cell characteristics of a perovskite solar cell obtained by using precursor solution (3) in Example 9.

The solar cell characteristics of the perovskite solar cells obtained by using precursor solution (1), precursor solution (2), and precursor solution (3) were measured. FIGS. 20 to 22 show the results. The results revealed that, in the previously known one-solution method, the hysteresis was large and the photoelectric conversion efficiency was also insufficient, namely, 14.0% for Forward and 12.0% for Reverse; and that, in contrast, when the complex of the present invention was used, the hysteresis was significantly reduced and the photoelectric conversion efficiency was significantly increased, namely, 16.9% and 17.0% for Forward, and 17.2% and 16.7% for Reverse. The results are unexpected considering that all of the complexes constituting the perovskite layers have the same composition.

Example 10: Perovskite Solar Cell

The patterned transparent conductive glass substrate (FTO, 25 mm×25 mm, Asahi Glass Co., Ltd., Japan) was subjected to ultrasonic cleaning using 1 mass % neutral detergent aqueous solution, acetone, 2-propanol, and distilled water in this order, individually for 10 minutes. Finally, UV ozone cleaning was performed for 15 minutes.

1 mL of titanium di(isopropoxide)bis(acetylacetonate) $(Ti(OiPr)_2(acac)_2$, 75 mass % 2-propanol solution, Tokyo Chemical Industry Co., Ltd., Japan) was added to 39 mL of ethanol (Wako, super-dehydrated water). The FTO substrates (transparent electrodes) were arranged on a hot plate at 450° C., and $Ti(OiPr)_2(acac)_2$ solution was sprayed (carrier gas: $N_2$, 0.5 MPa) thereto, thereby forming a compact $TiO_2$ layer (about 30 nm). Further, the obtained substrates were immersed in 100 mL of $TiCl_4$ (440 µL, special grade, Wako Pure Chemical Industries Ltd., Japan) aqueous solution at 70° C. for 30 minutes. Thereafter, the substrates were baked at 500° C. for 20 minutes, thereby forming a (positive hole) blocking layer.

On the obtained compact $TiO_2$ layer ((positive hole) blocking layer), $TiO_2$ paste (PST-18NR, JGC Catalysts and Chemicals Ltd.) dissolved in ethanol (paste:ethanol=1:8 (mass ratio)) was applied by spin coating in an amount of about 190 µL (per 2.5 cm square electrode), thereby forming a mesoporous $TiO_2$ layer (electron transport layer) having a thickness of about 100 to 150 nm.

The substrate that was provided with the above layers including the mesoporous $TiO_2$ layer (electron transport layer), and was also UV ozone-treated immediately before, was placed in a glove box. A solution was prepared by adding to a mixture of $PbI_2$ and MAI at 1:1 (molar ratio) a mixed solvent of DMF and DMSO (Vol, 3:1) while adjusting the concentration to 1.5 M. After addition and dissolution of MAI, the solution was applied to the mesoporous TiO$_2$ layer (electron transport layer) in an amount of about 250 μL (per 2.5 cm square electrode), followed by spin coating, during which 0.5 mL toluene was added dropwise, thereby obtaining a transparent film (slope 5 seconds, 5000 rpm, 5 seconds; toluene was added dropwise at the final 1 second, followed by slope 5 seconds before cessation). The obtained film was annealed for 5 minutes at 40° C., 5 to 30 minutes at 55° C.; thereafter, the film was further annealed for 5 minutes at 75° C., and then for 30 minutes at 100° C., thereby obtaining a flat and dense perovskite layer having a thickness of about 500 nm.

Positive hole transport materials (Spiro-OMeTAD; 2,2', 7,7'-tetrakis(N,N-di-p-methylphenylamine)-9,9'-spirobifluorene, 61.3 mg, 0.050 M), [tris(2-(1H-pyrazole-1-yl)-4-tert-butylpyridine)cobalt(III)tris(bis(trifluoromethylsulfonyl)imide)](FK209; 11.3 mg, 0.0075 M) and 4-tert-butylpyridine (TBP; 24.4 μL, 0.165 M, Aldrich), and lithium-bis(trifluoromethylsulfonyl)imide (LITFSI; 7.6 mg, 0.027 M, Wako Pure Chemical Industries Co., Ltd.) were dissolved in 1 mL of chlorobenzene. After 30-minute stirring, the solution was filtered by a membrane filter, and the filtrate was applied to the perovskite layer by spin coating. The resulting substrate was annealed for 30 minutes at 70° C. to form a positive hole transporting layer (about 200 nm); thereafter, a gold electrode of 80 nm was attached onto the positive hole transporting layer by vacuum deposition, thereby obtaining a perovskite solar cell.

Figure 23:
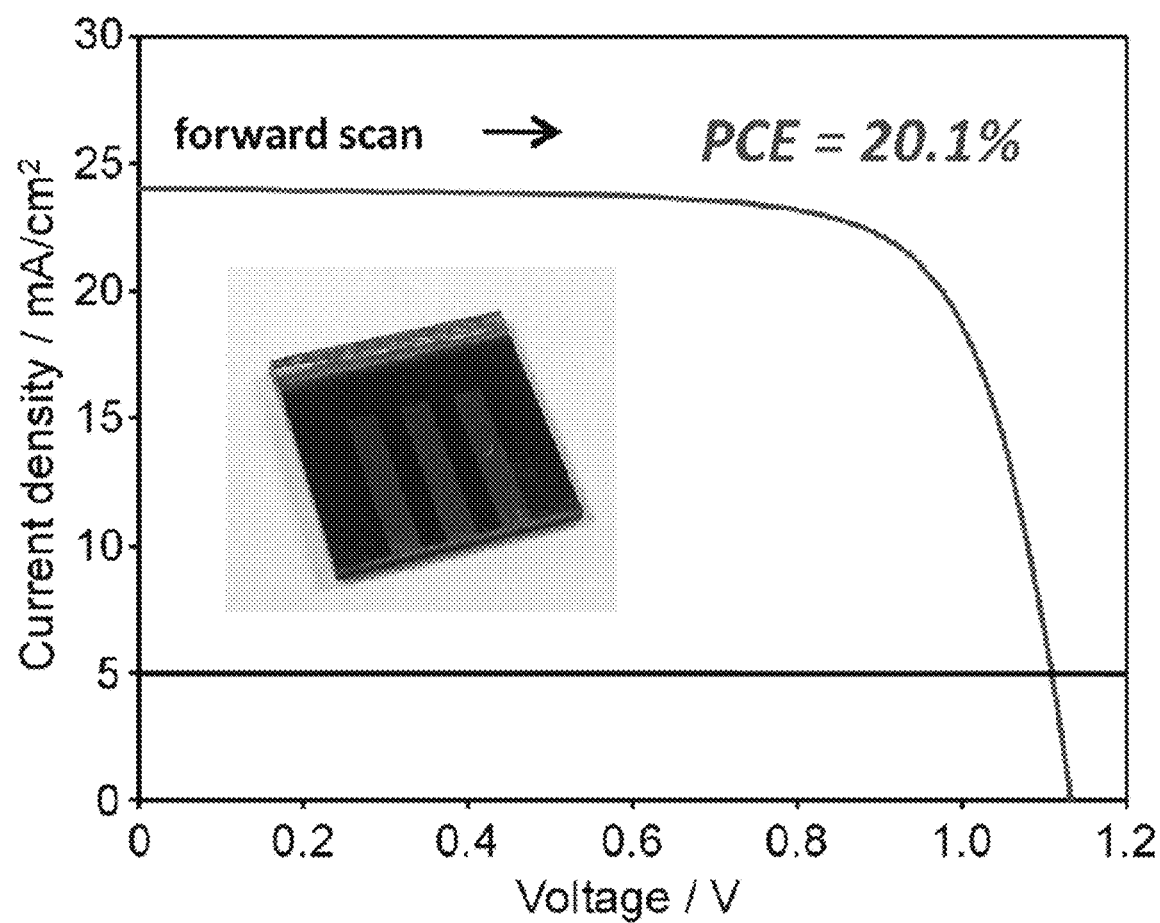
FIG. 23 shows the measurement results of power conversion efficiency (PCE) in Example 10.
Figure 24:
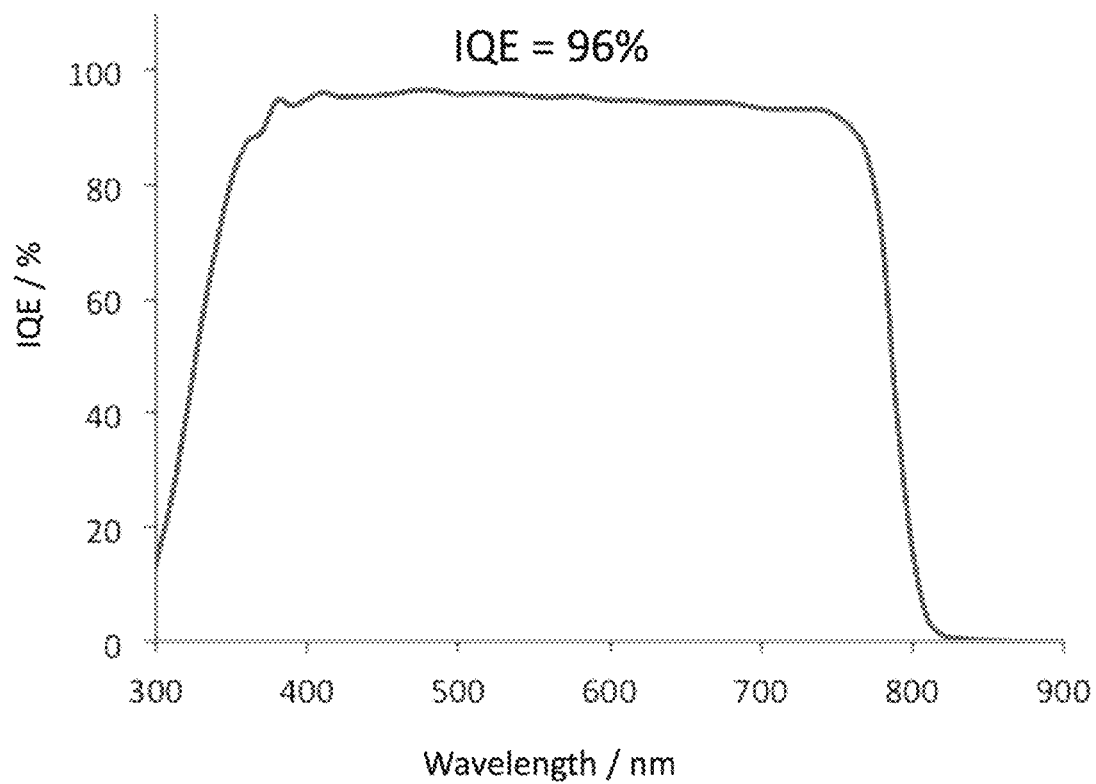
FIG. 24 shows the measurement results of internal quantum efficiency (IQE) in Example 10.

The power conversion efficiency (PCE) of the obtained perovskite solar cell was measured. The power conversion efficiency was 20.1%, as shown in FIG. 23. The internal quantum efficiency (IQE) was measured. The internal quantum efficiency was 96%, as shown in FIG. 24. Table 2 shows current density, voltage, and the like. Further, by using MAPbI$_3$.DMF complex as a raw material, 1.4 M solution dissolved only in DMSO was used to form a perovskite layer. The use of DMSO as a main solvent enables the spin coating process to be performed for a relatively long time. The solution was applied to a mesoporous TiO$_2$ layer (electron transport layer) in an amount of about 250 μL (per 2.5 cm square electrode), followed by spin coating, during which 0.5 mL toluene was added dropwise, thereby obtaining a transparent film (spin coating, slope 1 seconds, 1000 rpm, 40 seconds; the rotation stopped for 30 seconds; the rotation was started (spin coating, slope 5 seconds, 5000 rpm, 20 seconds); toluene was added dropwise at the final 1 second, followed by slope 1 second before cessation). The obtained film was annealed for 5 minutes at 40° C., 5 to 30 minutes at 55° C.; thereafter, the film was further annealed for 5 minutes at 75° C., and then for 30 minutes at 100° C., thereby obtaining a flat and dense perovskite layer having a thickness of about 500 nm. Thereafter, the same treatments as those in the above method were performed. As a result, a high power conversion efficiency (PCE=19.6%) was obtained with desirable reproducibility.

TABLE 2

| $J_{SC}$/mA·cm$^{-2}$ | $V_{OC}$/V | FF | PCE/% | $R_S$/Ω·cm$^2$ | $R_{SH}$/Ω·cm$^2$ |
|---|---|---|---|---|---|
| 24.04 | 1.13 | 0.74 | 20.1 | 7.7 | 1.8 × 10$^3$ |

The invention claimed is:

1. A complex comprising:
one or more compounds represented by general formula (1):

(1)

wherein R is a cation represented by the following formula:

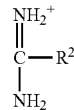

wherein R$^2$ represents a hydrogen atom, or a univalent substituted or unsubstituted hydrocarbon group; X is the same or different, and each represents a halogen atom; n1 is 0.8 to 1.2; and m1 is 2.8 to 3.2, or compounds represented by general formula (2):

 (2)

wherein X is as defined above; R$_2$ is a cation represented by R$^1$NH$_3^+$, wherein R$^1$ represents a univalent substituted or unsubstituted hydrocarbon group, or the following formula:

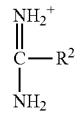

wherein R$^2$ represents a hydrogen atom, or a univalent substituted or unsubstituted hydrocarbon group; n2 is 2.8 to 3.2; and m2 is 7.7 to 8.3; and
one or more dimethylformamide molecules,
wherein the complex is a crystal, and the one or more dimethylformamide molecules are within the crystal.

2. The complex according to claim 1, wherein the complex is represented by general formula (1A):

 (1A)

wherein R, X, n1 and m1 are as defined above in general formula (1); DMF represents dimethylformamide; and k1 is 0.8 to 2.2, or general formula (2A):

 (2A)

wherein R$_2$, X, n2, m2 and DMF are as defined above in general formula (2); and k2 is 1.8 to 2.2.

3. The complex according to claim 1, wherein X is an iodine atom.

4. The complex according to claim 1, wherein the complex is a needle-like crystal.

5. The complex according to claim 1, wherein the complex is a perovskite precursor.

6. A production method for producing the complex according to claim 1, the method comprising the step of:
dissolving a compound represented by general formula (3):

PbX$_2$ wherein X is as defined above,
and a compound represented by general formula (4):

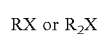

wherein R, R$_2$, and X are as defined above in general formula (1) or general formula (2)
in a first organic solvent containing dimethylformamide.

7. The production method according to claim 6, wherein the first organic solvent further comprises dimethylsulfoxide, and the content ratio of dimethylformamide to dimethylsulfoxide is such that dimethylformamide:dimethylsulfoxide=4.0 or more:1.0 (molar ratio).

8. The production method according to claim 6, comprising the step of:
adding a second organic solvent after the dissolving step.

9. The production method according to claim 8, wherein the ratio of the amount of the first organic solvent to be used to the amount of the second organic solvent to be added is such that the second organic solvent: the first organic solvent=0.05 to 2.0:1.0 (volume ratio).

10. A film comprising the complex according to claim 1.

11. A film comprising a perovskite precursor in which a needle-like microcrystal is oriented substantially in parallel, the film thickness is in a range of 100 to 1000 nm, and the surface flatness measured by a scanning electron microscope is such that the height difference in a range of 500 nm×500 nm in the horizontal direction is 50 nm or less,
the perovskite precursor comprising a complex comprising:
one or more compounds represented by general formula (1):

wherein R is a cation represented by the following formula:

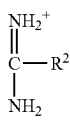

wherein $R^2$ represents a hydrogen atom, or a univalent substituted or unsubstituted hydrocarbon group; X is the same or different, and each represents a halogen atom; n1 is 0.8 to 1.2; and m1 is 2.8 to 3.2, or compounds represented by general formula (2):

wherein X is as defined above; $R_2$ is a cation represented by $R^1NH_3^+$,
wherein $R^1$ represents a univalent substituted or unsubstituted hydrocarbon group, or the following formula:

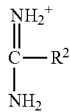

wherein $R^2$ represents a hydrogen atom, or a univalent substituted or unsubstituted hydrocarbon group; n2 is 2.8 to 3.2; and m2 is 7.7 to 8.3;
and one or more solvent molecules,
wherein the complex is a crystal, and the one or more dimethylformamide molecules are within the crystal.

12. A production method for producing the film according to claim 11, the method comprising the step of:
dissolving a compound represented by general formula (3):

wherein X is as defined above, and
a compound represented by general formula (4):

wherein R, $R_2$, and X are as defined above in general formula (1) or general formula (2)
in a third organic solvent; then applying the solution to a substrate; and thereafter adding a fourth organic solvent dropwise to the solution.

13. A perovskite material represented by general formula (1):

wherein R is a cation represented by the following formula:

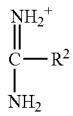

wherein $R^2$ represents a hydrogen atom, or a univalent substituted or unsubstituted hydrocarbon group; X is the same or different, and each represents a halogen atom; n1 is 0.8 to 1.2; and m1 is 2.8 to 3.2,
or a perovskite material represented by general formula (2):

wherein X is as defined above; $R_2$ is a cation represented by $R^1NH_3^+$, wherein $R^1$ represents a univalent substituted or unsubstituted hydrocarbon group, or the following formula:

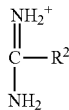

wherein $R^2$ represents a hydrogen atom, or a univalent substituted or unsubstituted hydrocarbon group; n2 is 2.8 to 3.2; and m2 is 7.7 to 8.3, and
one or more dimethylformamide molecules,
wherein the perovskite material is a crystal, and the one or more dimethylformamide molecules are within the crystal,
wherein the perovskite material being substantially free from the lead halide represented by general formula (3):

wherein X is as defined above.

14. The perovskite material according to claim 13, wherein a major component is formed of grains of 10 nm or more, when surface observation is performed by a scanning electron microscope.

15. A production method for producing a perovskite material, comprising the step of heating the complex according to claim 1.

16. A production method for producing the perovskite material according to claim 13, the method comprising the step of dissolving a compound represented by general formula (3):

wherein X is as defined above,
and a compound represented by general formula (4):

wherein R, $R_2$, and X are as defined above in general formula (1) or general formula (2)

in a third organic solvent, followed by heating.

17. A perovskite layer comprising the complex according to claim 1.

18. The perovskite layer according to claim 17, wherein the needle-like microcrystal is oriented substantially in parallel, the film thickness is in a range of 200 to 500 nm, and the surface flatness measured by a scanning electron microscope is such that the height difference in a range of 500 nm×500 nm in the horizontal direction is 50 nm or less.

19. A production method for producing a perovskite layer using the complex according to claim 1, the method comprising the step of:

dissolving the complex in a third organic solvent, then applying the resulting solution to a substrate, and thereafter adding a fourth organic solvent dropwise to the solution, followed by heating.

20. A production method for producing a perovskite layer using the film according to claim 11, the method comprising the step of: heating the film.

21. A production method for producing a perovskite layer using the perovskite material according to claim 13, the method comprising the step of:

dissolving a compound represented by general formula (3):

PbX$_2$ wherein X is as defined above, and a compound represented by general formula (4):

RX or R$_2$X wherein R, $R_2$, and X are as defined above in general formula (1) or general formula (2)

in a third organic solvent, then applying the solution to a substrate, and thereafter adding a fourth organic solvent dropwise to the solution, followed by heating.

22. A perovskite solar cell comprising the complex according to claim 1.

23. A perovskite solar cell comprising the perovskite layer according to claim 17.

\* \* \* \* \*